US010056454B2

(12) United States Patent
Kim et al.

(10) Patent No.: US 10,056,454 B2
(45) Date of Patent: Aug. 21, 2018

(54) SEMICONDUCTOR DEVICE AND METHOD OF MANUFACTURING THE SAME

(71) Applicant: SAMSUNG ELECTRONICS CO., LTD., Suwon-si, Gyeonggi-Do (KR)

(72) Inventors: Ho-Jun Kim, Suwon-si (KR); Jong-Ho Lee, Seoul (KR); Geum-Jong Bae, Suwon-si (KR); Dong-Chan Suh, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 63 days.

(21) Appl. No.: 15/336,111

(22) Filed: Oct. 27, 2016

(65) Prior Publication Data

US 2017/0256611 A1    Sep. 7, 2017

(30) Foreign Application Priority Data

Mar. 2, 2016    (KR) ........................ 10-2016-0025043

(51) Int. Cl.
| | |
|---|---|
| *H01L 27/088* | (2006.01) |
| *H01L 29/06* | (2006.01) |
| *H01L 29/78* | (2006.01) |
| *H01L 29/16* | (2006.01) |
| *H01L 21/8234* | (2006.01) |
| *B82Y 10/00* | (2011.01) |

(Continued)

(52) U.S. Cl.
CPC .......... *H01L 29/0673* (2013.01); *B82Y 10/00* (2013.01); *H01L 21/823431* (2013.01); *H01L 27/0886* (2013.01); *H01L 29/0665* (2013.01); *H01L 29/16* (2013.01); *H01L 29/42392* (2013.01); *H01L 29/66439* (2013.01); *H01L 29/775* (2013.01); *H01L 29/785* (2013.01)

(58) Field of Classification Search
CPC .... H01L 29/41725–29/41791; H01L 29/7839; H01L 29/806; H01L 29/66583; H01L 29/66515; H01L 29/665–29/66507; H01L 21/823475; H01L 21/823871; H01L 27/11273; H01L 29/66696; H01L 29/66727; H01L 29/7809; H01L 29/0843
See application file for complete search history.

(56) References Cited

U.S. PATENT DOCUMENTS

| | | |
|---|---|---|
| 8,422,273 B2 | 4/2013 | Chang et al. |
| 8,472,239 B2 | 6/2013 | Chang et al. |

(Continued)

FOREIGN PATENT DOCUMENTS

| | | |
|---|---|---|
| JP | 5744854 | 5/2015 |
| KR | 1020150099217 | 8/2015 |

*Primary Examiner* — Julio J Maldonado
*Assistant Examiner* — Stanetta Isaac
(74) *Attorney, Agent, or Firm* — F. Chau & Associates, LLC.

(57) ABSTRACT

A semiconductor device includes a semiconductor substrate. A first fin extends in a first direction. A first nano sheet structure includes at least two first nano sheets which extend in the first direction parallel to an upper surface of the first fin. A second fin extends in the first direction. A second nano sheet structure includes at least two second nano sheets which extend in the first direction parallel to an upper surface of the second fin. At least one of the at least two first nano sheets has a different thickness from at least one of the at least two second nano sheets.

20 Claims, 38 Drawing Sheets

(51) Int. Cl.
*H01L 29/423* (2006.01)
*H01L 29/66* (2006.01)
*H01L 29/775* (2006.01)

(56) References Cited

U.S. PATENT DOCUMENTS

| | | |
|---|---|---|
| 8,987,794 B2 | 3/2015 | Rachmady et al. |
| 9,012,284 B2 | 4/2015 | Glass et al. |
| 9,171,843 B2 | 10/2015 | Ching et al. |
| 2008/0135949 A1 | 6/2008 | Lo et al. |
| 2013/0001517 A1 | 1/2013 | Bangsaruntip et al. |
| 2014/0001441 A1* | 1/2014 | Kim .................. H01L 29/0673 257/29 |
| 2014/0239420 A1* | 8/2014 | Basker .............. H01L 29/66803 257/412 |
| 2014/0353574 A1 | 12/2014 | Li et al. |
| 2015/0069328 A1* | 3/2015 | Leobandung ......... H01L 29/775 257/24 |
| 2015/0243733 A1 | 8/2015 | Yang et al. |
| 2016/0027870 A1* | 1/2016 | Cheng ................ H01L 29/0673 257/347 |

* cited by examiner

SEMICONDUCTOR DEVICE AND METHOD OF MANUFACTURING THE SAME

CROSS-REFERENCE TO RELATED APPLICATION

This application claims priority under 35 U.S.C. § 119 to Korean Patent Application No. 10-2016-0025043, filed on Mar. 2, 2016, in the Korean Intellectual Property Office, the disclosure of which is incorporated by reference herein in its entirety.

TECHNICAL FIELD

The inventive concept relates to a semiconductor device and a method of manufacturing the same, and more particularly, to a semiconductor device including a nano sheet (NS) and a method of manufacturing the same.

DISCUSSION OF THE RELATED ART

Recently, sizes of semiconductor devices are being reduced. Since not only a fast operating speed but also an operational accuracy is needed for semiconductor devices, research is being conducted in optimizing a structure of transistors included in the semiconductor devices.

SUMMARY

The inventive concept relates to a semiconductor device that may control current and realize multi-threshold voltages (Multi-Vt) by using a nano sheet (NS), and a method of manufacturing the same.

According to an exemplary embodiment of the inventive concept, a semiconductor device includes a semiconductor substrate. A first fin activation area includes a first fin extending in a first direction, wherein the first fin protrudes from the semiconductor substrate. A first nano sheet structure includes at least two first nano sheets which extend in the first direction parallel to an upper surface of the first fin, and the at least two first nano sheets are spaced apart from the upper surface of the first fin and from each other. A second fin activation area includes a second fin extending in the first direction, wherein the second fin protrudes from the semiconductor substrate. A second nano sheet structure includes at least two second nano sheets which extend in the first direction parallel to an upper surface of the second fin, and the at least two second nano sheets are spaced apart from the upper surface of the second fin and from each other. A first gate electrode extends in a second direction crossing the first direction and surrounds the at least two first nano sheets, wherein a gate insulating layer is disposed between the first gate electrode and each of the at least two first nano sheets. A second gate electrode extends in the second direction and surrounds the at least two second nano sheets, wherein a gate insulating layer is disposed between the second gate electrode and each of the at least two second nano sheets. The at least two first nano sheets are connected to first source/drain areas of the first fin activation area. The at least two second nano sheets are connected to second source/drain areas of the second fin activation area. At least one of the at least two first nano sheets has a different thickness from at least one of the at least two second nano sheets. The thicknesses of each of the at least two first nano sheets and the at least two second nano sheets are measured in a third direction that is perpendicular to an upper surface of the semiconductor substrate.

According to an exemplary embodiment of the inventive concept, a semiconductor device includes a semiconductor substrate including a first area and a second area. A first nano sheet structure includes at least two first nano sheets disposed in the first area, wherein the at least two first nano sheets are separated from each other and from an upper surface of the semiconductor substrate in a direction perpendicular to the upper surface of the semiconductor substrate, wherein the at least two first nano sheets extend in a first direction parallel to the upper surface of the semiconductor substrate. A second nano sheet structure includes at least two second nano sheets disposed in the second area, wherein the at least two second nano sheets are separated from each other and from the upper surface of the semiconductor substrate in the direction perpendicular to the upper surface of the semiconductor substrate, wherein the at least two second nano sheets extend in the first direction parallel to the upper surface of the semiconductor substrate. The at least two first nano sheets are connected to first source/drain areas disposed in the first area, wherein the first source/drain areas are disposed on the upper surface of the semiconductor substrate. The at least two second nano sheets are connected to second source/drain areas disposed in the second area, wherein the second source/drain areas are disposed on the upper surface of the semiconductor substrate. At least one of the at least two first nano sheets has a thickness that is different from a thickness of at least one of the at least two second nano sheets, wherein the thicknesses of the at least one of the at least two first nano sheets and the at least one of the at least two second nano sheets are measured in the direction perpendicular to the upper surface of the semiconductor substrate.

According to an exemplary embodiment of the inventive concept, a semiconductor device includes a substrate including a first fin, a second fin and a third fin, each of which extends in a first direction. The semiconductor device includes a first gate electrode, a second gate electrode and a third gate electrode, each of which extends in a second direction crossing the first direction, wherein the first gate electrode overlaps the first fin, the second gate electrode overlaps the second fin, and the third gate electrode overlaps the third fin. At least two first nano sheets are disposed on the first fin and are spaced from the first fin and from each other in a third direction crossing the first and second directions, at least two second nano sheets are disposed on the second fin and are spaced from the second fin and from each other in the third direction, and at least two third nano sheets are disposed on the third fin and are spaced from the third fin and from each other in the third direction. The first gate electrode is disposed between the at least two first nano sheets and between the first fin and the first nano sheet most adjacent to the first fin, the second gate electrode is disposed between the at least two second nano sheets and between the second fin and the second nano sheet most adjacent to the second fin, and the third gate electrode is disposed between the at least two third nano sheets and between the third fin and the third nano sheet most adjacent to the third fin. One of the at least two first nano sheets has a first thickness, one of the at least two second nano sheets has a second thickness, and one of the at least three second nano sheets has a third thickness, wherein the first, second and third thicknesses are measured in the third direction. At least two of the first, second and third thicknesses are different from each other.

BRIEF DESCRIPTION OF THE DRAWINGS

Exemplary embodiments of the inventive concept will become more clearly understood from the following detailed description thereof in conjunction with the accompanying drawings, in which.

DETAILED DESCRIPTION OF THE EMBODIMENTS

Figure 1:
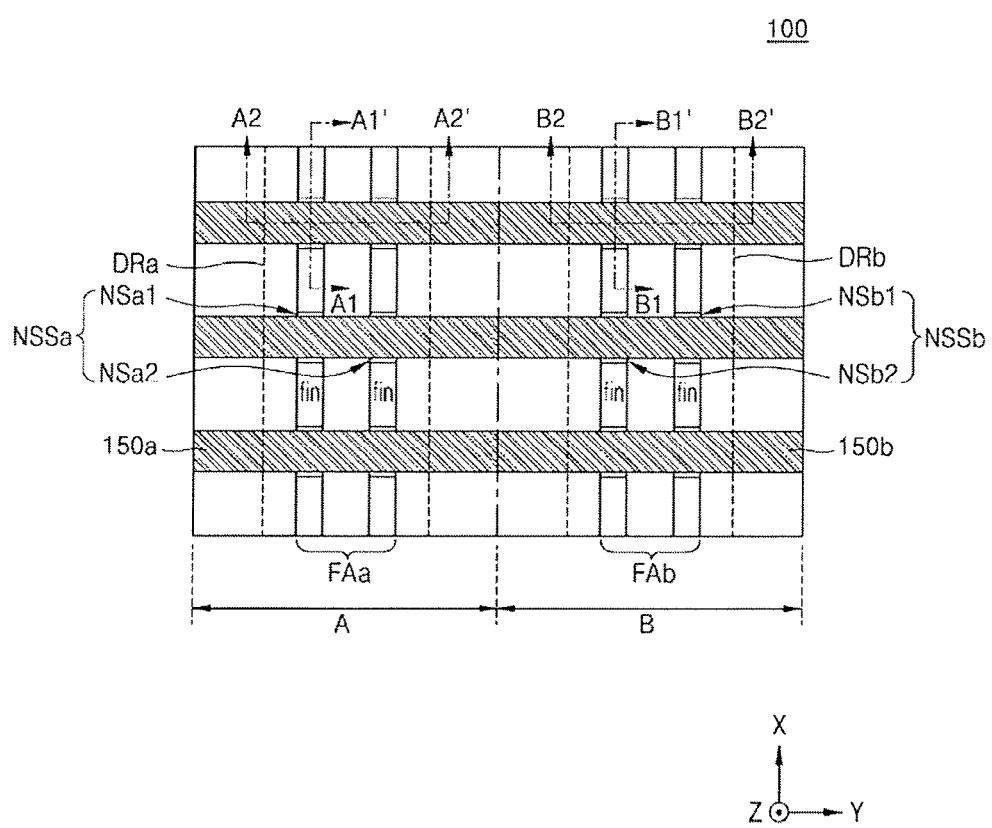
FIG. 1 is a plan view illustrating a semiconductor device according to an exemplary embodiment of the inventive concept.

Exemplary embodiments of the inventive concept will now be described more fully with reference to the accompanying drawings. The inventive concept may, however, be embodied in different forms and should not be construed as being limited to the embodiments set forth herein. When a layer or element is referred to as being on another layer or element, the layer or element may be directly disposed on the other layer or element, or intervening layers or elements may be present therebetween. Like reference numerals may refer to like elements throughout the specification. The layers and/or elements in the drawings may be exaggerated for clarity.

Figure 2A:
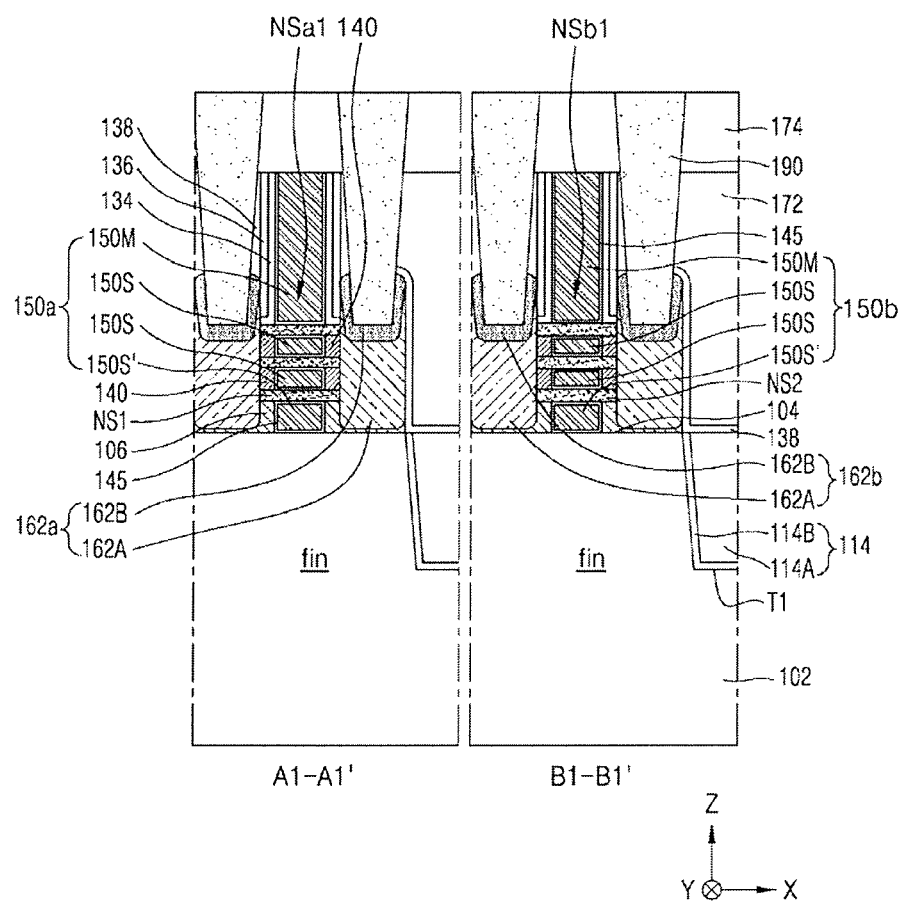
FIG. 2A is a cross-sectional view taken along lines A1-A1' and B1-B1' of FIG. 1 according to an exemplary embodiment of the inventive concept.
Figure 2B:
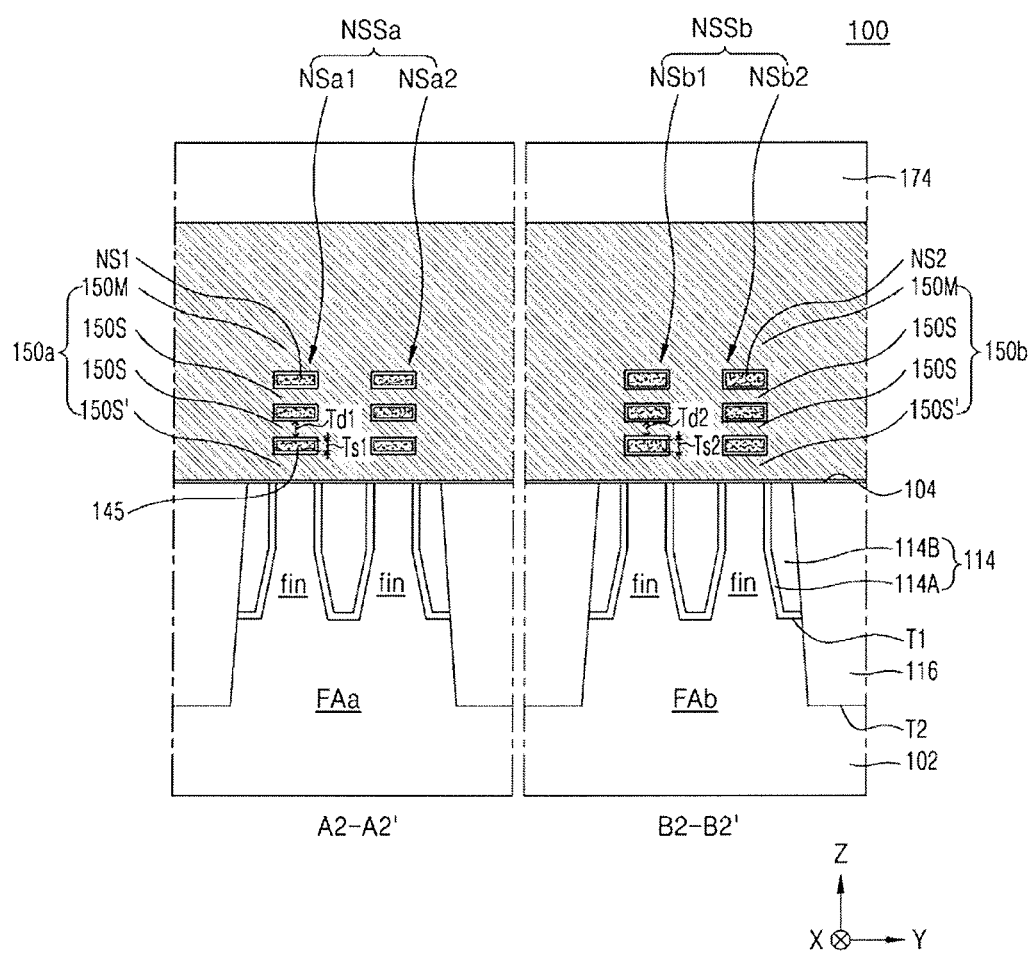
FIG. 2B is a cross-sectional view taken along lines A2-A2' and B2-B2' of FIG. 1 according to an exemplary embodiment of the inventive concept.

FIG. 1 is a plan view illustrating a semiconductor device 100 according to an exemplary embodiment of the inventive concept. FIG. 2A is a cross-sectional view taken along lines A1-A1' and B1-B1' of FIG. 1 according to an exemplary embodiment of the inventive concept. FIG. 2B is a cross-sectional view taken along lines A2-A2' and B2-B2' of FIG. 1 according to an exemplary embodiment of the inventive concept.

Referring to FIGS. 1 through 2B, the semiconductor device 100 may include a semiconductor substrate 102, nano sheet structures NSSa and NSSb, and first and second gate electrodes 150a and 150b. The semiconductor device 100 may include fin activation areas FAa and FAb.

The semiconductor substrate 102 may include a first area A and a second area B. Here, the first area A and the second area B may be connected to each other or may be spaced apart from each other. In an exemplary embodiment of the inventive concept, the first area A and the second area B may perform the same function. In an exemplary embodiment of the inventive concept, the first area A and the second area B may perform different functions. For example, the first area A may be a portion of a logic area, and the second area B may be another portion of the logic area. In an exemplary embodiment of the inventive concept, the first area A may be a memory area or a non-memory area, and the second area B may be a memory area when the first area A is a non-memory area, or the second area B may be the non-memory area when the first area A is the memory area. The memory area may include a static random access memory (SRAM) area, a dynamic random access memory (DRAM) area, a magnetic random access memory (MRAM) area, a resistive random access memory (RRAM) area, a phase-change dynamic random access memory (PRAM) area, etc., and the non-memory area may include a logic area.

The semiconductor substrate 102 may include a semiconductor, such as Si or Ge, or a compound semiconductor, such as SiGe, SiC, GaAs, InAs, or InP. In an exemplary embodiment of the inventive concept, the semiconductor substrate 102 may include a group III-V material and/or a group IV material. The group III-V material may include a binary, ternary, or tetra compound including a group III element and/or a group V element. The groups III-V material may include a compound including a III element, such as In, Ga, and Al, and/or a group V element, such as As, P, and Sb. For example, the group III-V material may be InP, $In_zGa_{1-z}As$ ($0 \le z \le 1$), and/or $Al_zGa_{1-z}As$ ($0 \le z \le 1$). The binary compound may be, for example, InP, GaAs, InAs, InSb, or GaSb. The ternary compound may be, for example, InGaP, InGaAs, AlInAs, InGaSb, GaAsSb, and/or GaAsP. The group IV material may be Si or Ge.

However, the group III-V material and the group IV material, which may be used in the semiconductor device 100, according to an exemplary embodiment of the inventive concept, are not limited to the materials described above. The group III-V material and the group IV material, such as Ge, may be used as a channel material for forming a transistor having a high speed and low power consumption. A semiconductor substrate including a group III-V material, such as GaAs, which has a higher electron mobility than a Si substrate, and a semiconductor substrate including a semiconductor material, such as Ge, which has a higher hole mobility than the Si substrate, may be used to realize a high performance complementary metal-oxide semiconductor (CMOS). In an exemplary embodiment of the inventive concept, when a merged metal-oxide semiconductor (MMOS) transistor is formed on the semiconductor substrate 102, the semiconductor substrate 102 may include any one of the group III-V materials described above. In an exemplary embodiment of the inventive concept, when a positive channel metal-oxide semiconductor (PMOS) transistor is formed on the semiconductor substrate 102, at least a portion of the semiconductor substrate 102 may include Ge. In an exemplary embodiment of the inventive concept, the semiconductor substrate 102 may have a silicon-on-insulator (SOI) structure. The semiconductor substrate 102 may include a conductive area, for example, a well or a structure doped with impurities.

A shallow trench isolation (STI) layer 114 may define a boundary of fins of the fin activation areas FAa and FAb. The STI layer 114 may be formed on the semiconductor substrate 102. A device separating layer 116 may define a boundary of device areas DRa and DRb. The device separating layer 116 may be formed on the semiconductor substrate 102. The STI layer 114 may fill a first trench T1, and the device separating layer 116 may fill a second trench T2. The second trench T2 may be formed deeper into the semiconductor substrate 102 than the first trench T1. The STI layer 114 may include an insulating liner 114A conformally covering an inner wall of the first trench T1, and a gap-fill insulating layer 114B on the insulating liner 114A.

The insulating liner 114A may include an oxide layer, SiN, SiON, SiBN, SiC, SiC:H, SiCN, SiCN:H, SiOCN, SiOCN:H, SiOC, $SiO_2$, polysilicon, or a combination thereof. In an exemplary embodiment of the inventive concept, the insulating liner 114A may have a thickness of about 10 Å to about 100 Å. However, the thickness of the insulating liner 114A is not limited thereto.

In an exemplary embodiment of the inventive concept, the gap-fill insulating layer 114B may include an oxide layer. For example, the gap-fill insulating layer 114B may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ). However, materials of the gap-fill insulating layer 114B are not limited thereto. The gap-fill insulating layer 114B may be formed by a deposition or a coating process. For example, the gap-fill insulating layer 114B may be formed by flowable chemical vapor deposition (FCVD) or spin coating.

The device separating layer 116 may include an oxide layer, a nitride layer, or a combination thereof. In an exemplary embodiment of the inventive concept, the device separating layer 116 and the gap-fill insulating layer 114B may include the same material.

As illustrated in FIGS. 2A and 2B, an upper surface 104 of the fin activation areas FAa and FAb, an upper surface of the STI layer 114, and an upper surface of the device separating layer 116 may have the same height or substantially the same height with respect to the semiconductor substrate 102.

The fin activation areas FAa and FAb may include the first fin activation area FAa disposed in the first area A, and the second fin activation area FAb disposed in the second area B. Each of the first fin activation area FAa and the second fin activation area FAb may include a plurality of fins having a structure protruding from the semiconductor substrate 102 and extending in a first direction (e.g., an X direction). For example, each of the first fin activation area FAa and the second fin activation area FAb may include two fins. In FIG. 1, the first fin activation area FAa of the first area A and the second fin activation area FAb of the second area B extend in the same first direction (e.g., the X direction). However, the first fin activation area FAa of the first area A and the second fin activation area FAb of the second area B may extend in different directions with respect to each other.

In the semiconductor device 100, according to the present embodiment, each of the first fin activation area FAa and the second fin activation area FAb includes two fins. However, the number of fins included in each of the first fin activation area FAa and the second fin activation area FAb is not limited thereto. For example, each of the first fin activation area FAa and the second fin activation area FAb may include one fin, or three or more fins. In addition, the number of fins included in the first fin activation area FAa and the number of fins included in the second fin activation area FAb may be different. For example, the first fin activation area FAa may include one fin, and the second fin activation area FAb may include two or more fins.

The nano sheet structures NSSa and NSSb may be disposed on the fin activation areas FAa and FAb. For example, the first nano sheet structure NSSa may be disposed on the first fin activation area FAa and the second nano sheet structure NSSb may be disposed on the second fin activation area FAb.

Each of the first nano sheet structure NSSa and the second nano sheet structure NSSb may include a plurality of nano sheets NS1 and NS2 stacked in a third direction (e.g., a Z direction). For example, the first nano sheet structure NSSa may include a first stack structure NSa1 and a second stack structure NSa2, in each of which three first nano sheets NS1 are stacked apart from one another in the third direction (e.g., the Z direction). The first stack structure NSa1 may be disposed on a left fin, and the second stack structure NSa2 may be disposed on a right fin. In addition, the first nano sheets NS1 of the first stack structure NSa1 and the first nano sheets NS1 of the second stack structure NSa2 may be apart from each other in a second direction (e.g., a Y direction).

The second nano sheet structure NSSb may include a first stack structure NSb1 and a second stack structure NSb2, in each of which three second nano sheets NS2 are stacked apart from one another in the third direction (e.g., the Z direction). The first stack structure NSb1 may be disposed on a left fin, and the second stack structure NSb2 may be disposed on a right fin. Also, the second nano sheets NS2 of the first stack structure NSb1 and the second nano sheets NS2 of the second stack structure NSb2 may be apart from each other in the second direction (e.g., the Y direction).

Each of the first nano sheets NS1 and the second nano sheets NS2 may have a sheet structure. For example, each of the first nano sheets NS1 and the second nano sheets NS2 may have a sheet structure having a thickness of about several nm in the third direction (the Z direction) and a width of about several to dozens of nm in the first and second directions (the X and Y directions). However, sizes of the first nano sheet NS1 and the second nano sheet NS2 are not limited thereto.

In the semiconductor device 100 of FIG. 1, each of the first stack structure NSa1 or NSb1 and the second stack structure NSa2 or NSb2 includes three stacked nano sheets NS1 and NS2. However, the number of nano sheets NS1 and NS2 included in each of the first stack structure NSa1 or NSb1 and the second stack structure NSa2 or NSb2 is not limited to three. For example, each of the first stack structure NSa1 or NSb1 and the second stack structure NSa2 or NSb2 may include one nano sheet NS1 or NS2, or a stack of a plurality of nano sheets NS1 or NS2. The first nano sheet structure NSSa includes the first stack structure NSa1 and the second stack structure NSa2, and the second nano sheet structure NSSb includes the first stack structure NSb1 and the second stack structure NSb2. However, structures of the first nano sheet structure NSSa and the second nano sheet structure NSSb are not limited thereto. For example, each of the first nano sheet structure NSSa and the second nano sheet structure NSSb may each include one stack structure or three or more stack structures apart from one another.

The first nano sheets NS1 may be formed in a space between the fins of the first fin activation area FAa and the first gate electrode 150a, at an area covered by the first gate electrode 150a. The second nano sheets NS2 may be formed in a space between the fins of the second fin activation area FAb and the second gate electrode 150b, at an area covered by the second gate electrode 150b. A width of the first and second stack structures NSa1 and NSa2, including the first nano sheets NS1, in the first direction (the X direction) may be greater than a width of the first gate electrode 150a in the first direction (the X direction). A width of the first and second stack structures NSb1 and NSb2, including the second nano sheets NS2, in the first direction (the X direction) may be greater than a width of the second gate electrode 150b in the first direction (the X direction). FIG. 1 illustrates the example in which the first and second stack structures NSa1, NSa2, NSb1, and NSb2 have approximately square shapes or rectangular shapes in plan view. However, plan shapes of the first and second stack structures NSa1, NSa2, NSb1, and NSb2 are not limited thereto. For example, the first and second stack structures NSa1, NSa2, NSb1, and NSb2 may have various shapes in plan view, depending on shapes of the first and second fin activation areas FAa and FAb in plan view, and plan shapes of the first and second gate electrodes 150a and 150b.

In the semiconductor device 100, according to the present embodiment, the first nano sheet NS1 of the first nano sheet structure NSSa may have a first thickness Ts1, and the second nano sheet NS2 of the second nano sheet structure NSSb may have a second thickness Ts2. The first thickness Ts1 may be smaller than the second thickness Ts2. A first distance Td1 between the first nano sheets NS1 in the third direction (the Z direction) may be greater than a second distance Td2 between the second nano sheets NS2 in the third direction (the Z direction). Here, it is assumed that a gate insulating layer 145 has a very small thickness, and has the same thickness in the first nano sheets NS1 and the second nano sheets NS2. Thus, for convenience of illustration, the first distance Td1 and the second distance Td2 are indicated as the distance between the gate insulating layers 145. For example, since the gate insulating layer 145 has a very small thickness, and has the same thickness in the first nano sheet NS1 and the second nano sheet NS2, a difference between a distance between the first nano sheets NS1 and a distance between the second nano sheets NS2 may be substantially the same as a difference between the first distance Td1 and the second distance Td2.

In an exemplary embodiment of the inventive concept, the first nano sheets NS1 and the second nano sheets NS2 may include a same material as each other. In an exemplary embodiment of the inventive concept, the first nano sheets NS1 and the second nano sheets NS2 may include the same material as the semiconductor substrate 102. For example, each of the first nano sheets NS1 and the second nano sheets NS2 may include Si or silicon germanium (SiGe). However, the materials that may be included in the first nano sheets NS1 and the second nano sheets NS2 are not limited thereto.

The first nano sheets NS1 and the second nano sheets NS2 may include a channel area. For example, as illustrated in FIG. 2A, the three first nano sheets NS1, included in the first stack structure NSa1 in the first area A, may be disposed between the first source/drain areas 162a. The three first nano sheets NS1 may function as a channel area between the first source/drain areas 162a. Also, three second nano sheets NS2 included in the second stack structure NSb2 in the second area B may be between the second source/drain areas 162b and may function as a channel area between the second source/drain areas 162b.

As illustrated in FIG. 2B, the first nano sheets NS1 and the second nano sheets NS2 may have a structure in which four surfaces of each of the first nano sheets NS1 and four surfaces of each of the second nano sheets NS2 are respectively surrounded by the first and second gate electrodes 150a and 150b. For example, upper and lower surfaces and both side surfaces of each of the first nano sheets NS1 and upper and lower surfaces and both side surfaces of each of the second nano sheet NS2 may be respectively surrounded by the first and second gate electrodes 150a and 150b. Thus, the channel areas formed by the first nano sheets NS1 and the channel areas formed by the second nano sheets NS2 may have different channel widths. The different channel widths of the first nano sheets NS1 and the second nano sheets NS2 may correspond to the perimeters of the first nano sheets NS1 and the second nano sheets NS2. The perimeters of the first nano sheets NS1 and the second nano sheets NS2, respectively, correspond to the total length of the upper, lower, left and right surfaces of the first nano sheet NS1 and the second nano sheet NS2. Also, since six nano sheets NS1 and six nano sheets NS2 are respectively arranged in each of the first and second gate electrodes 150a and 150b, the channel widths of the first and second nano sheets NS1 and NS2, respectively, may correspond to six times the perimeter of one nano sheet NS1 or NS2.

When a transistor includes the nano sheet structures NSSa and NSSb, thicknesses of the nano sheets NS1 and NS2 may be adjusted to adjust a channel width, and a channel current corresponding thereto. Thus, when the transistor includes the nano sheet structures NSSa and NSSb, the channel current of the transistor may be controlled as needed.

When thicknesses of the nano sheets NS1 and NS2 included in the nano sheet structures NSSa and NSSb are small, for example, several nm in size, a quantum confinement effect may occur. By using the quantum confinement effect, a threshold voltage Vt of the transistor may be adjusted. Thus, when a quantum confinement effect occurs by forming the nano sheets NS1 and NS2 included in the nano sheet structures NSSa and NSSb to have different thicknesses and small thicknesses, the transistor may have different threshold voltages Vt. For example, a semiconductor device having multiple threshold voltages Multi-Vt may be realized by using the nano sheet structures NSSa and NSSb.

Each of the first and second gate electrodes 150a and 150b may extend in the second direction (the Y direction) on the semiconductor substrate 102 across the fin activation areas FAa and FAb. The first and second gate electrodes 150a and 150b may include first gate electrodes 150a in the first area A and second gate electrodes 150b in the second area B. In FIG. 1, the fin activation areas FAa and FAb and the corresponding first and second gate electrodes 150a and 150b perpendicularly cross each other. However, the fin activation areas FAa and FAb and the corresponding first and second gate electrodes 150a and 150b may cross each other at other angles other than perpendicularly. Also, in FIG. 1, both the first gate electrodes 150a of the first area A and the second gate electrodes 150b of the second area B extend in the same direction, for example, the second direction (the Y direction). However, the first gate electrodes 150a of the first area A and the second gate electrodes 150b of the second area B may extend in different directions and/or in a direction other than the second direction (the Y direction).

Three first gate electrodes 150a cross the first fin activation area FAa, and three second gate electrodes 150b cross the second fin activation area FAb in FIG. 1. However, the inventive concept is not limited thereto. For example, one first gate electrode 150a or a plurality of first gate electrodes 150a may cross the first fin activation area FAa, and one second gate electrode 150b or a plurality of second gate electrodes 150b may cross the second fin activation area FAb. The first gate electrodes 150a and the second gate electrodes 150b may or may not be electrically connected with each other.

The first gate electrodes 150a may cover the first nano sheet structure NSSa, and the second gate electrodes 150b may cover the second nano sheet structure NSSb. For example, each of the first gate electrodes 150a may cover the first nano sheet structure NSSa and surround at least some of the six first nano sheets NS1. For example, each of the first gate electrodes 150a may cover an upper surface and a lower surface of each of the six first nano sheets NS1 in the second direction (the Y direction) and in the first direction (the X direction). In addition, each of the first gate electrodes 150a may include a main gate portion 150M covering an upper surface of the first nano sheet structure NSSa, and a plurality of sub-gate portions 150S and 150S' connected to the main gate portion 150M and disposed between the first fin activation area FAa and the first nano sheets NS1 and between the first nano sheets NS1. A thickness of each of the plurality of sub-gate portions 150S and 150S' may be smaller than a thickness of the main gate portion 150M. Here, the thickness of the plurality of sub-gate portions 150S and 150S' and the thickness of the main gate portion 150M may be measured in the third direction (the Z direction).

A structure in which the second gate electrodes 150b cover the second nano sheet structure NSSb may be substantially the same as a structure in which the first gate electrodes 150a cover the first nano sheet structure NSSa. The gate insulating layer 145 may be disposed between the first gate electrodes 150a and the first nano sheets NS1, and between the second gate electrodes 150b and the second nano sheets NS2.

The gate insulating layer 145 may be formed as a stack of an interfacial layer and a high-dielectric layer. The interfacial layer may cure an interfacial defect between the upper surface of the fin activation areas FAa and FAb and the high-dielectric layer, and between the surface of the first and second nano sheets NS1 and NS2 and the high-dielectric layer. In an exemplary embodiment of the inventive concept, the interfacial layer may include a low dielectric material layer having a dielectric constant that is equal to or lower than about 9, for example, a silicon oxide layer, a silicon oxynitride layer, or a combination thereof. In an exemplary embodiment of the inventive concept, the interfacial layer may include silicate, a combination of silicate and a silicon oxide layer, or a combination of silicate and a silicon oxynitride layer. In an exemplary embodiment of the inventive concept, the interfacial layer may be omitted. The high-dielectric layer may include a material having a higher dielectric constant than a material of a silicon oxide layer. For example, the high-dielectric layer may have a dielectric constant that is between about 10 and about 25. The high-dielectric layer may include a Hf-based or a Zr-based material. For example, the high-dielectric layer may include $HfO_2$, HfSiO, HfSiON, HfON, HfAlO, HfLaO, $ZrO_2$, ZrSiO, etc.

Materials of the high-dielectric layer are not limited to the Hf-based or the Zr-based material. The high-dielectric layer may include other materials, such as $La_2O_3$, $LaAlO_3$, $Ta_2O_5$, $TiO_2$, $SrTiO_3$, $Y_2O_3$, $Al_2O_3$, $PbSc_{0.5}Ta_{0.5}O_3$, $PbZnNbO_3$, etc.

The high-dielectric layer may be formed by atomic layer deposition (ALD), chemical vapor deposition (CVD), or physical vapor deposition (PVD). The high-dielectric layer may have a thickness of, for example, about 10 Å to about 40 Å. However, thicknesses of the high-dielectric layer are not limited thereto.

The first and second gate electrodes 150a and 150b may include a metal containing layer for adjusting a work function, and a metal containing layer for gap-filling. The metal containing layer for gap-filling may fill an upper space of the metal containing layer for adjusting a work function. In an exemplary embodiment of the inventive concept, the first and second gate electrodes 150a and 150b may have a structure in which a metal nitride layer, a metal layer, a conductive capping layer, and a gap-fill metal layer are sequentially stacked. Each of the metal nitride layer and the metal layer may include a metal, for example, Ti, W, Ru, Nb, Mo, Hf, Ni, Co, Pt, Yb, Tb, Dy, Er, and/or Pd. Each of the metal nitride layer and the metal layer may be formed by ALD, metal organic ALD (MOALD), or metal organic CVD (MOCVD). The conductive capping layer may serve as a protection layer that prevents oxidization of a surface of the metal layer. Also, the conductive capping layer may serve as a wetting layer that facilitates deposition when another conductive layer is deposited on the metal layer. The conductive capping layer may include, but is not limited to, metal nitride, for example, TiN, TaN, or a combination thereof. The gap-fill metal layer may extend on the conductive capping layer. The gap-fill metal layer may be formed to have a W shape. The gap-fill metal layer may be formed by an ALD, CVD, or PVD process. The gap-fill metal layer may bury (e.g., fill) a recess, which may be formed by a step difference between areas on the upper surface of the conductive capping layer. In an exemplary embodiment of the inventive concept, the first and second gate electrodes 150a and 150b may include a stack of TiAlC/TiN/W, a stack of TiN/TaN/TiAlC/TiN/W, or a stack of TiN/TaN/TiN/TiAlC/TiN/W. In these stacks, the TiAlC layer or the TiN layer may serve as the metal containing layer for adjusting a work function.

The fin activation areas FAa and FAb may include a plurality of source/drain areas 162a and 162b, respectively, on fins at both side surfaces of the first and second gate electrodes 150a and 150b, in the first direction (the X direction). Each of the source/drain areas 162a and 162b may be connected to an end of the nano sheets NS1 and NS2 to which each of the source/drain areas 162a and 162b is adjacent. For example, the three first nano sheets NS1 may be connected to the first source/drain area 162a of the first fin activation area FAa, and the three second nano sheets NS2 may be connected to the second source/drain area 162b of the second fin activation area FAb.

The source/drain areas 162a and 162b may include a semiconductor layer 162A epitaxially grown from the nano sheets NS1 and NS2. For example, the source/drain areas 162a and 162b may include an epitaxially grown Si layer, an epitaxially grown SiC layer, an epitaxially grown SiGe layer, etc. The SiGe layer may be formed as an embedded SiGe structure including a plurality of SiGe layers. The source/drain areas 162a and 162b may further include a metal silicide layer 162B formed on the semiconductor layer 162A. In an exemplary embodiment of the inventive concept, the metal silicide layer 162B may include titanium silicide. However, the inventive concept is not limited thereto. In an exemplary embodiment of the inventive concept, the metal silicide layer 162B may be omitted.

As illustrated in FIG. 2A, an insulating liner 134, a first insulating spacer 136, and a protection layer 138 may be sequentially formed cover both side walls of the first and second gate electrodes 150a and 150b on the first and second stack structures NSa1 and NSb1 in the first direction (the X direction). The protection layer 138 may extend to cover the plurality of source/drain areas 162a and 162b. Each of the insulating liner 134, the first insulating spacer 136, and the protection layer 138 may include a silicon nitride layer. However, the inventive concept is not limited thereto. In an exemplary embodiment of the inventive concept, the protection layer 138 may be omitted. The insulating liner 134, the first insulating spacer 136, and the protection layer 138 may cover a side wall of the main gate portion 150M of the first and second gate electrodes 150a and 150b.

A second insulating spacer 140 may be formed in spaces between the nano sheets NS1 and NS2 and contact the source/drain areas 162a and 162b. The second insulating spacer 140 may be disposed between the sub-gate portion 150S and the source/drain areas 162a and 162b, in the spaces between the plurality of nano sheets NS1 and NS2. The second insulating spacer 140 may cover a portion of a side wall of at least one of the plurality of sub-gate portions 150S. The semiconductor device 100 illustrated in FIG. 2A has a structure in which both side walls of two sub-gate portions 150S of the three sub-gate portions 150S and 150S', except the sub-gate portion 150S' which is most adjacent to the fin activation areas FAa and FAb, are at least partially covered by the second insulating spacer 140. As illustrated in FIG. 2A, both side walls of the sub-gate portion 150S', which is most adjacent to the fin activation areas FAa and FAb, from among the three sub-gate portions 150S and 150S', may be covered with a buffer semiconductor layer 106 covering the upper surface 104 of the fin activation areas FAa and FAb. The buffer semiconductor layer 106 may include a material that may be different from a material included in the fin activation areas FAa and FAb and the nano sheets NS1 and NS2. For example, the fin activation areas FAa and FAb may include Si, and the buffer semiconductor layer 106 may include Ge.

The first insulating spacer 136 and the second insulating spacer 140 may include different materials from each other. In an exemplary embodiment of the inventive concept, the first insulating spacer 136 may include a silicon nitride layer, and the second insulating spacer 140 may include a silicon nitride layer further including an O element, a B element, a C element, or elements formed by the combination thereof. In an exemplary embodiment of the inventive concept, the first insulating spacer 136 may include an insulating layer on a surface of which a semiconductor element may not be seeded or epitaxially grown, and the second insulating spacer 140 may include an insulating layer, on at least a portion of a surface of which a semiconductor element may be seeded or epitaxially grown. For example, the first insulating spacer 136 may include a SiN layer, and the second insulating spacer 140 may include a SiON layer. The SiON layer may be formed to contact the semiconductor layer 162A of the source/drain areas 162a and 162b.

In an exemplary embodiment of the inventive concept, at least some of the second insulating spacers 140 may include an air space. In addition, the second insulating spacer 140 may have a multi-layer structure. In an exemplary embodiment of the inventive concept, the second insulating spacer 140 may include an air space, SiN, SiCN, SiBN, SiON, SiOCN, SiBCN, SiOC, and/or $SiO_2$. For example, the second insulating spacer 140 may have a structure of at least three layers. At least one of the three layers may be an air space.

An inter-gate insulating layer 172 and an interlayer insulating layer 174 may be sequentially formed on a side surface and at an upper portion of the source/drain areas 162a and 162b. Each of the inter-gate insulating layer 172 and the interlayer insulating layer 174 may include a silicon oxide layer. However, the inventive concept is not limited thereto.

A contact plug 190 may be disposed on each of the source/drain areas 162a and 162b. The contact plug 190 may penetrate the interlayer insulating layer 174, the inter-gate insulating layer 172, and the protection layer 138. The contact plug 190 may be connected to the source/drain areas 162a and 162b. The metal silicide layer 162B may be disposed between the semiconductor layer 162A and the contact plug 190. The contact plug 190 may include a metal, a conductive metal nitride, or a combination thereof. For example, the contact plug 190 may include W, Cu, Al, Ti, Ta, TiN, TaN, an alloy thereof, or a combination thereof. However, materials included in the contact plug 190 are not limited thereto.

In the semiconductor device 100, according to the present embodiment, the nano sheet structures NSSa and NSSb including the nano sheets NS1 and NS2 are used to form a transistor. A channel width of the transistor may be adjusted by varying the thicknesses of the nano sheets NS1 and NS2 so that a channel current of the transistor may be controlled as needed.

In addition, in the semiconductor device 100 according to the present embodiment, thicknesses of the nano sheets NS1 and NS2 included in each of the nano sheet structures NSSa and NSSb may be small and may be different from each other. Thus, the semiconductor device 100 may have multi-threshold voltages Multi-Vt due to the quantum confinement effect.

Hereinafter, when "first" and "second" are not explicitly described, an element to which a reference numeral "a" is added may denote an element formed in the first area A, and an element to which a reference numeral "b" is added may denote an element formed in the second area B. However, some elements, for example, device separating layer 116, the inter-gate insulating layer 172, etc., may not be divided into the first area A and the second area B.

FIGS. 3 through 6 are cross-sectional views of semiconductor devices 100a, 100b, 100c, and 100d, corresponding to the cross-sectional view of FIG. 2B, according to exemplary embodiments of the inventive concept. A detailed description of elements already described with reference to FIGS. 1 through 2B may be omitted for brevity.

Figure 3:
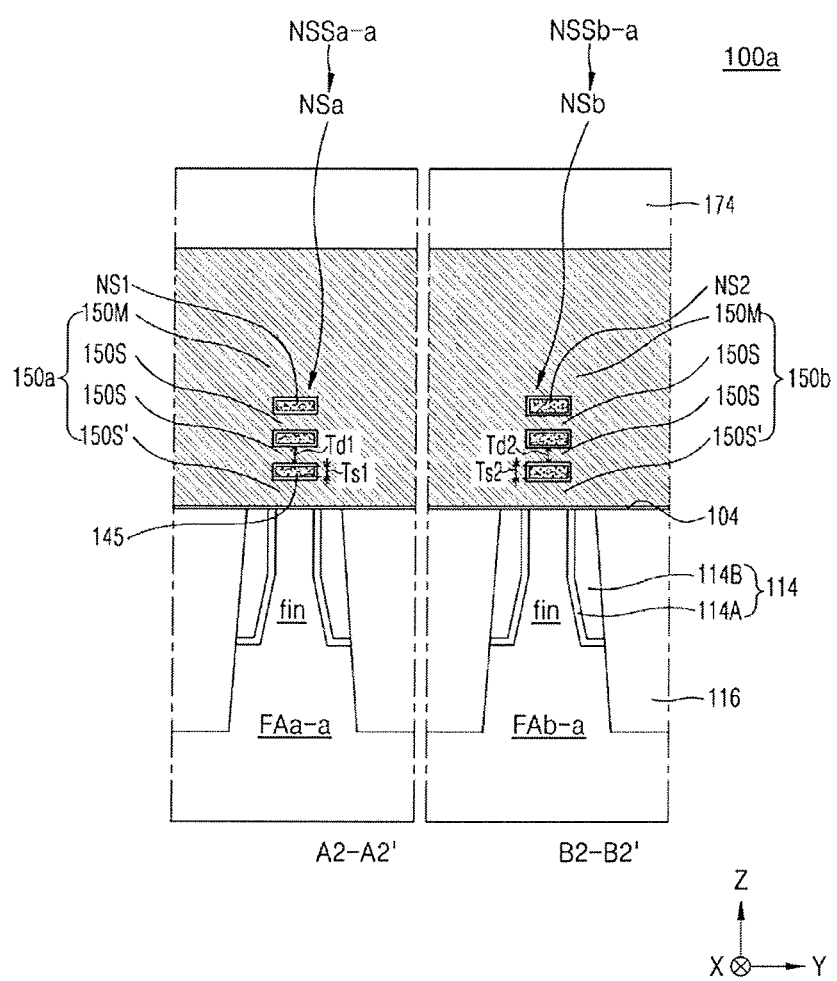
FIGS. 3 through 6 are cross-sectional views of semiconductor devices corresponding to the cross-sectional view of FIG. 2B, according to exemplary embodiments of the inventive concept.

Referring to FIG. 3, the semiconductor device 100a, according to an exemplary embodiment of the inventive concept, may differ from the semiconductor device 100 of FIG. 2B. For example, in the semiconductor device 100a, each of the first fin activation area FAa-a and the second fin activation area FAb-a may include one fin. Accordingly, in the first fin activation area FAa-a, the first nano sheet structure NSSa-a may include one stack structure NSa in which three first nano sheets NS1 may be stacked. In addition, in the second fin activation area FAb-a, the second nano sheet structure NSSb-a may include one stack structure NSb in which three second nano sheets NS2 may be stacked.

In the stack structure NSa of the first nano sheet structure NSSa-a, the first nano sheets NS1 may have a first thickness Ts1 in a third direction (the Z direction), and the first nano sheets NS1 may have a first distance Td1 between one another. Also, in the stack structure NSb of the second nano sheet structure NSSb-a, the second nano sheets NS2 may have a second thickness Ts2 in the third direction (the Z direction) and the second nano sheets NS2 may have a second distance Td2 between one another.

Figure 4:
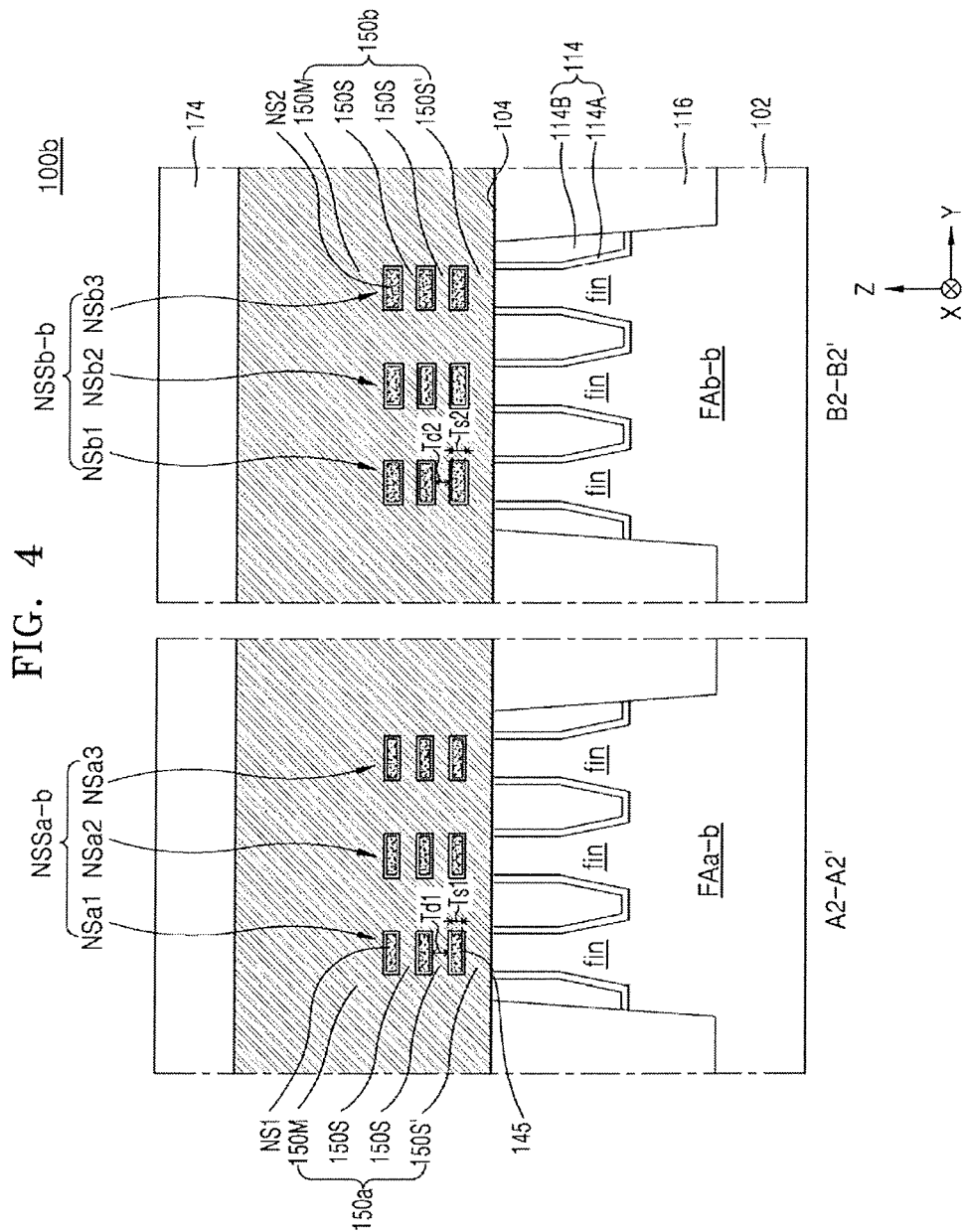

Referring to FIG. 4, the semiconductor device 100b, according to an exemplary embodiment of the inventive concept, may differ from the semiconductor device 100 of FIG. 2B. For example, each of the first fin activation area FAa-b and the second fin activation area FAb-b of the semiconductor device 100b may include three fins. Accordingly, in the first fin activation area FAa-b, the first nano sheet structure NSSa-b may include a first stack structure NSa1, a second stack structure NSa2, and a third stack structure NSa3. Each of the first to third stack structures NSa1 to NSa3 may include three first stacked nano sheets NS1. In the second fin activation area FAb-b, the second nano sheet structure NSSb-b may include a first stack structure NSb1, a second stack structure NSb2, and a third stack structure NSb3. Each of the first to third stack structures NSb1 to NSb3 may include three first stacked nano sheets NS1.

In the stack structures NSa1, NSa2, and NSa3 of the first nano sheet structure NSSa-b, the first nano sheets NS1 may have a first thickness Ts1 in the third direction (the Z direction), and the first nano sheets NS1 may have a first distance Td1 between one another. Also, in the stack structures NSb1, NSb2, and NSb3 of the second nano sheet structure NSSb-b, the second nano sheets NS2 may have a second thickness Ts2 in the third direction (the Z direction) and the second nano sheets NS2 may have a second distance Td2 between one another.

In the semiconductor devices 100a and 100b of FIGS. 3 and 4, the nano sheet structures NSSa-a, NSSb-a, NSSa-b, and NSSb-b include one stack structure or three stack structures. However, structures of the nano sheet structures are not limited thereto and may vary. In addition, as described above, the number of nano sheets included in each of the stack structures is not limited to three and may vary as needed.

Figure 5:
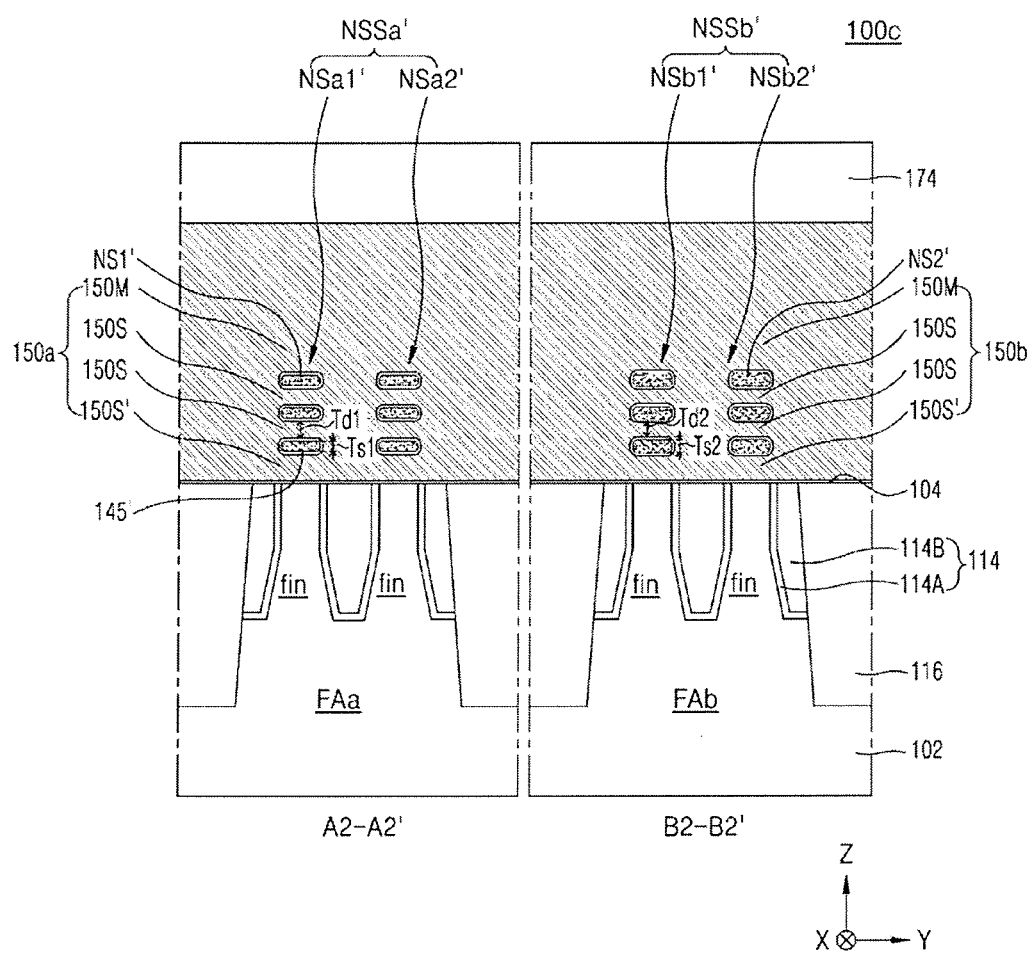

Referring to FIG. 5, the semiconductor device 100c, according to an exemplary embodiment of the inventive concept, may differ from the semiconductor device 100 of FIG. 2B. For example, in the semiconductor device 100c, according to an exemplary embodiment of the inventive concept, the first nano sheets NS1' included in stack structures NSa1' and NSa2' of a first nano sheet structure NSSa' may have a cross-section that is oval-shaped, or for example, has rounded corners in the second direction (the Y direction). The second nano sheets NS2' included in stack structures NSb1' and NSb2' of a second nano sheet structure NSSb' may also have a cross-section that is oval-shaped or for example, has rounded corners, in the second direction (the Y direction). Since the first and second nano sheets NS1' and NS2' may be oval-shaped or have rounded corners, a gate insulating layer 145' surrounding the first and second nano sheets NS1' and NS2' may also be oval-shaped or have rounded corners.

In the semiconductor device 100c, the first nano sheet structure NSSa' may include the two stack structures NSa1' and NSa2', and the second nano sheet structure NSSb' may include the two stack structures NSb1' and NSb2'. However, the first nano sheet structure NSSa' and the second nano sheet structure NSSb' may include one stack structure, like the semiconductor device 100a of FIG. 3, or three stack structures, like the semiconductor devices1 100b of FIG. 4. Alternatively, the first nano sheet structure NSSa' and the second nano sheet structure NSSb' may each include four or more stack structures. In addition, the number of first and second nano sheets NS1' and NS2' included in the stack structures NSa1', NSa2', Nsb1', and Nsb2' is not limited to three and may vary as needed.

In the stack structures NSa1' and NSa2' of the first nano sheet structure NSSa', the first nano sheets NS1' may have a first thickness Ts1 in the third direction (the Z direction) and the first nano sheets NS1' may have a first distance Td1 between one another. Also, in the stack structures NSb1' and NSb2' of the second nano sheet structure NSSb', the second nano sheets NS2' may have a second thickness Ts2 in the third direction (the Z direction) and the second nano sheets NS2' may have a second distance Td2 between one another. Here, the thickness and distance between the nano sheets may denote an average thickness of the nano sheets and an average distance in the third direction (the Z direction) between the nano sheets.

Figure 6:
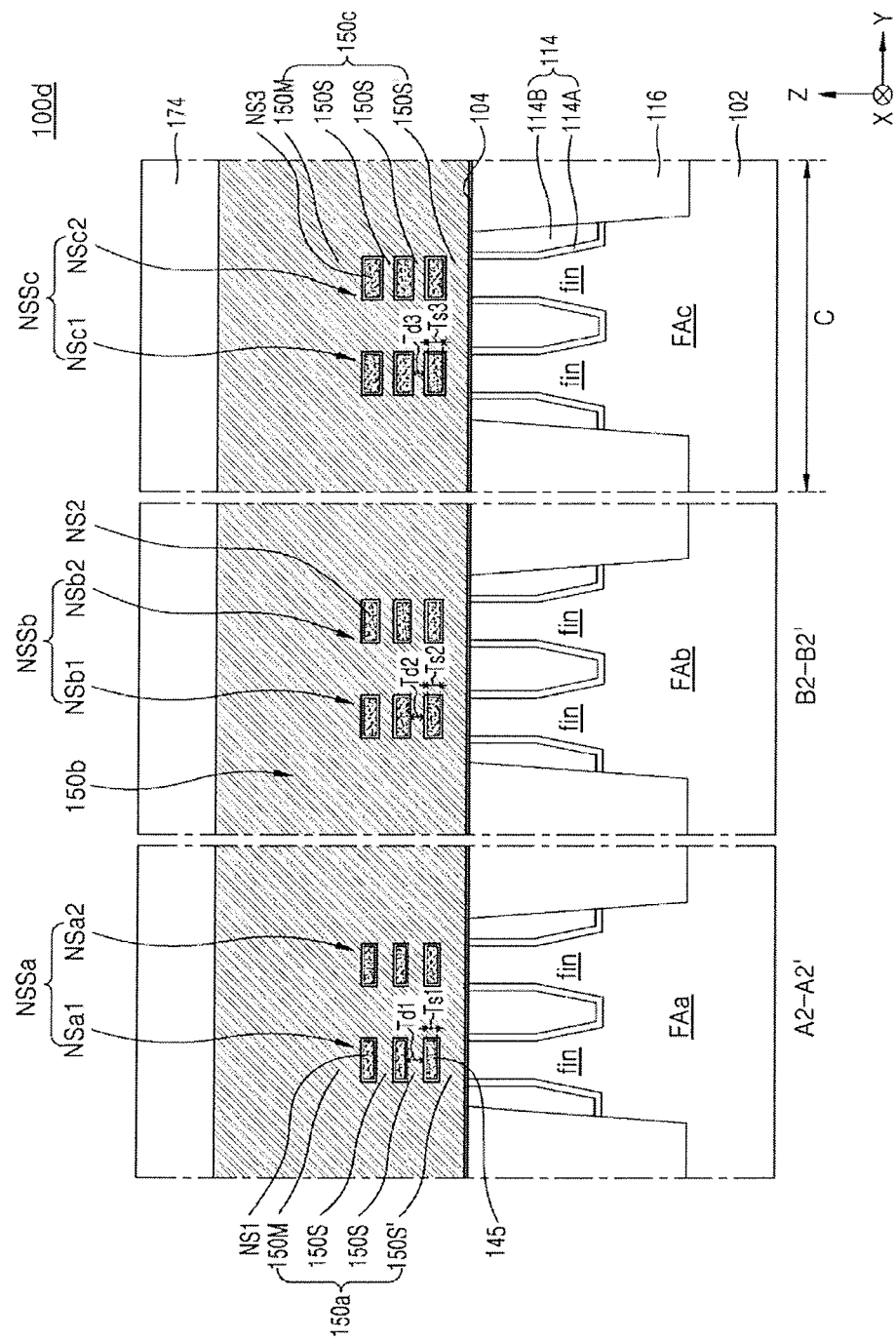

Referring to FIG. 6, in the semiconductor device 100d, according to an exemplary embodiment of the inventive concept, the semiconductor substrate 102 may include a third area C. The substrate 102 may include a third fin activation area FAc. A boundary of the third fin activation area FAc may be defined by the STI layer 114 and the device separating layer 116. The third fin activation area FAc may include two fins. A plurality of third gate electrodes 150c may extend across the third fin activation area FAc. Each of the third gate electrodes 150c may include a main gate portion 150M and sub-gate portions 150S and 150S'.

A third nano sheet structure NSSc may be disposed on the third fin activation area FAc. The third nano sheet structure NSSc may include two stack structures NSc1 and NSc2. Each of the stack structures NSc1 and NSc2 may include three third nano sheets NS3. The third nano sheets NS3 may have a third thickness Ts3 in a third direction (the Z direction) and may have a third distance Td3 between one another. As illustrated in FIG. 6, the third thickness Ts3 may be greater than the second thickness Ts2. In addition, the third distance Td3 may be smaller than the second distance Td2.

FIGS. 7A through 7E are cross-sectional views illustrating adjustment of a thickness of a nano sheet in each area of a substrate in a method of manufacturing a semiconductor device, according to exemplary embodiments of the inventive concept.

Figure 7A:
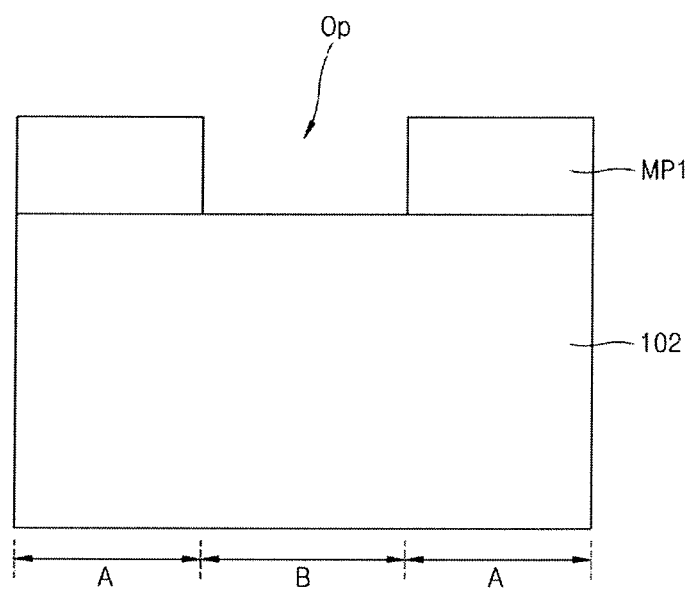
FIGS. 7A through 7E are cross-sectional views illustrating adjustment of a thickness of a nano sheet in each area of a substrate in a method of manufacturing a semiconductor device, according to exemplary embodiments of the inventive concept.

Referring to FIG. 7A, first, a first mask pattern MP1 may be formed on the semiconductor substrate 102. The first mask pattern MP1 may include silicon nitride, polysilicon, a spin-on hardmask (SOH) material, or a combination thereof. However, materials of the first mask pattern MP1 are not limited thereto. In an exemplary embodiment of the inventive concept, the SOH material may include a hydrocarbon compound having a relatively high carbon content which may be about 85% of the total weight to about 99% of the total weight of the SOH material, or a derivative thereof. The first mask pattern MP1 may include a pad oxide layer below the first mask pattern MP1.

As illustrated in FIG. 7A, the first mask pattern MP1 may include an open portion Op opening an upper surface of the semiconductor substrate 102 in the second area B. A portion covered by the first mask pattern MP1 may correspond to the first area A. Here, although the open portion Op corresponds to the second area B, the open portion Op may also correspond to the first area A. In other words, the open portion Op may correspond to the first area A, and the portion covered by the first mask pattern Mp1 may correspond to the second area B.

Figure 7B:
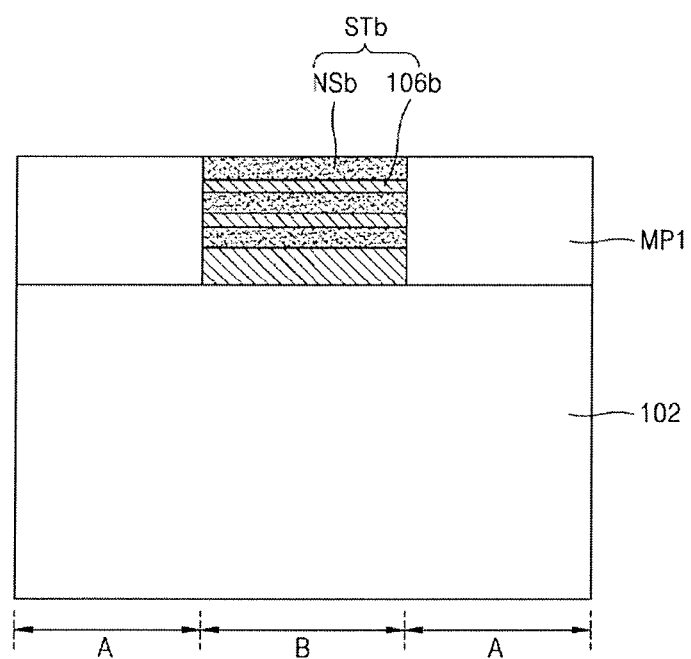

Referring to FIG. 7B, a first stack structure STb, in which a plurality of sacrificial semiconductor layers 106b and a plurality of semiconductor layers NSb, are alternately stacked one-by-one on the semiconductor substrate 102 in the second area B. The plurality of semiconductor layers NSb may correspond to nano sheets. The sacrificial semiconductor layers 106b and the semiconductor layers NSb may be formed by, for example, epitaxial growing. The sacrificial semiconductor layers 106b and the semiconductor layers NSb may include different materials from each other. In an exemplary embodiment of the inventive concept, the sacrificial semiconductor layers 106b may include SiGe, and the semiconductor layers NSb may include Si. However, materials of the sacrificial semiconductor layers 106b and the semiconductor layers NSb are not limited thereto. A thickness of a sacrificial semiconductor layer 106b that is most adjacent to the semiconductor substrate 102, from among the sacrificial semiconductor layers 106b, may be greater than thicknesses of the other sacrificial semiconductor layers 106b. However, the inventive concept is not limited thereto. For example, all of the sacrificial semiconductor layers 106b may have the same thickness.

When the sacrificial semiconductor layers 106b include SiGe, the sacrificial semiconductor layers 106b may be formed such that Ge is included as a first concentration. For example, the first concentration may be about 30% by weight of the total weight of the sacrificial semiconductor layers 106b. In this case, the sacrificial semiconductor layers 106b may include about 70% Ge by weight.

The Ge concentration may be different between a lowermost sacrificial semiconductor layer 106b (e.g., the closest to the substrate 102) and upper sacrificial semiconductor layers 106b. For example, the lowermost sacrificial semiconductor layer 106b may have a Ge concentration of about 20% by weight, and the upper sacrificial semiconductor layers 106b may have a Ge concentration of about 30% by weight. However, the Ge concentrations of the lowermost sacrificial semiconductor layer 106b and the upper sacrificial semiconductor layers may also be the same.

The semiconductor layers NSb may be formed to have a thickness that takes into account, for example, removing or annealing the sacrificial semiconductor layers 106b to achieve a final desired thickness of the nano sheets. In addition, the semiconductor layers NSb may have a thickness such that the a quantum confinement effect may occur due to final nano sheets. For example, the semiconductor layer NSb may be formed to have a thickness of several to dozens of nm. The sacrificial semiconductor layer 106b may be formed to be thinner than the semiconductor layer NSb. However, the lowermost sacrificial semiconductor layer 106b may be formed to be thicker than the semiconductor layer NSb.

Figure 7C:
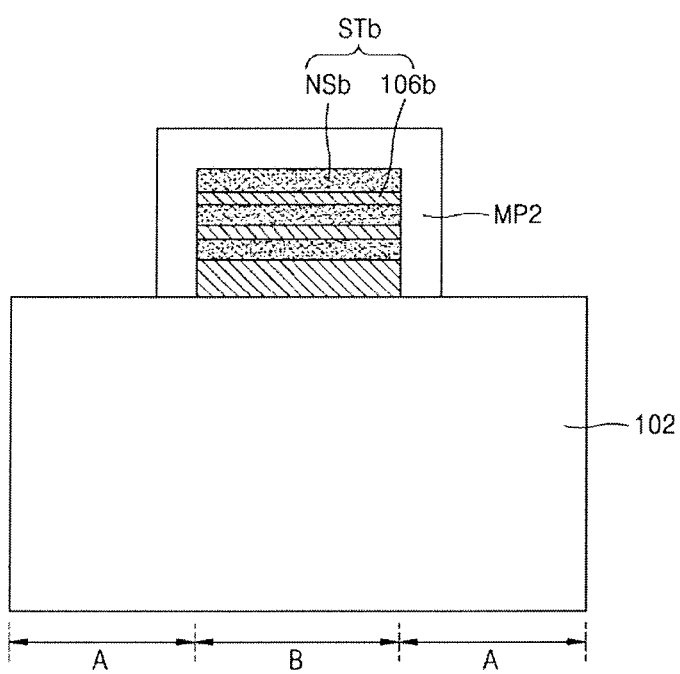

Referring to FIG. 7C, after the first stack structure STb is formed in the second area B, the first mask pattern MP1 is removed. A second mask pattern MP2 may be formed on the first stack structure STb to surround the first stack structure STb. The second mask pattern MP2 may include silicon nitride, polysilicon, an SOH material, or a combination thereof. However, materials of the second mask pattern MP2 are not limited thereto. The second mask pattern MP2 may include the same material as the first mask pattern MP1 or may include a different material from the first mask pattern MP1.

When the second mask pattern MP2 includes the same material as the first mask pattern MP1, the second mask pattern MP2 may be formed without removing the first mask pattern MP1. For example, the second mask pattern MP2 may be formed by forming a material layer for a mask on the first stack structure STb and the first mask pattern MP1, and patterning the first mask pattern MP1 and the material layer for a mask by using photolithography, etching, or the like.

After the second mask pattern MP2 is formed, the first area A of the semiconductor substrate 102 may be exposed. However, a portion of the second mask pattern MP2 may be disposed in the first area A. The portion of the first area A on which the second mask pattern MP2 is disposed may be filled with an insulating layer at a later process.

Figure 7D:
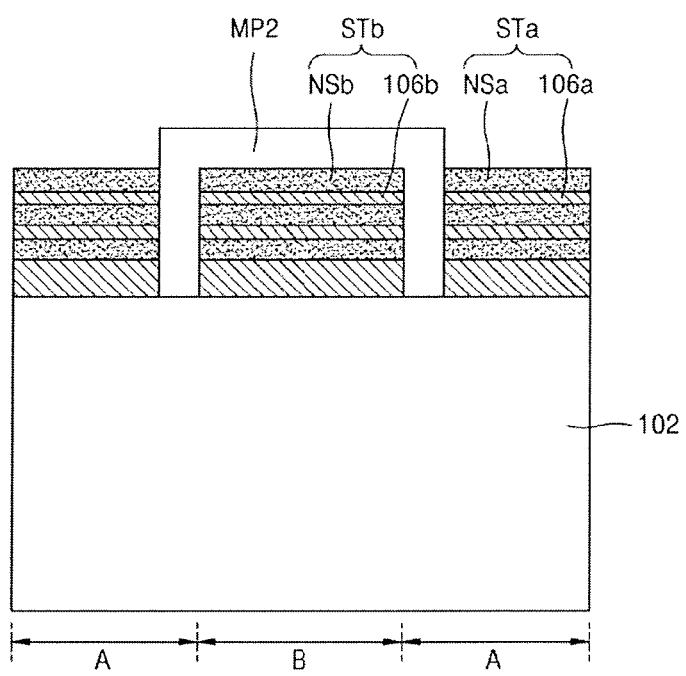

Referring to FIG. 7D, a second stack structure STa, in which a plurality of sacrificial semiconductor layers 106a and a plurality of semiconductor layers NSa are alternately stacked one-by-one, is formed on the semiconductor substrate 102 in the first area A. The plurality of semiconductor layers NSa may correspond to nano sheets. The sacrificial semiconductor layers 106a and the semiconductor layers NSa may be epitaxially grown. The sacrificial semiconductor layers 106a and the semiconductor layers NSa may include the same materials as the sacrificial semiconductor layers 106b and the semiconductor layers NSb of the first stack structure STb. For example, the sacrificial semiconductor layers 106a may include SiGe, and the semiconductor layers NSa may include Si.

As illustrated in FIG. 7D, the sacrificial semiconductor layers 106a and the semiconductor layers NSa included in the second stack structure STa may be formed to have the same thickness as the sacrificial semiconductor layers 106b and the semiconductor layers NSa of the first stack structure STb. In other words, each of the sacrificial semiconductor layers 106a may be formed to have the same thickness as each of the sacrificial semiconductor layers 106b. Also, each of the semiconductor layers NSa may be formed to have the same thickness as each of the semiconductor layers NSb.

When the sacrificial semiconductor layers 106a include SiGe, the sacrificial semiconductor layers 106a may be formed to include Ge as a second concentration. The second concentration may be higher than the first concentration. For example, the second concentration may be about 40% by weight Ge. Like in the first stack structure STb, a lowermost sacrificial semiconductor layer 106a and upper sacrificial semiconductor layers 106a may have different Ge concentrations. For example, the lowermost sacrificial semiconductor layer 106a may have a Ge concentration of about 30%, and the upper sacrificial semiconductor layers 106a may have a Ge concentration of about 40%. However, the lowermost sacrificial semiconductor layer 106a and the upper sacrificial semiconductor layers 106a may also have the same Ge concentration.

Figure 7E:
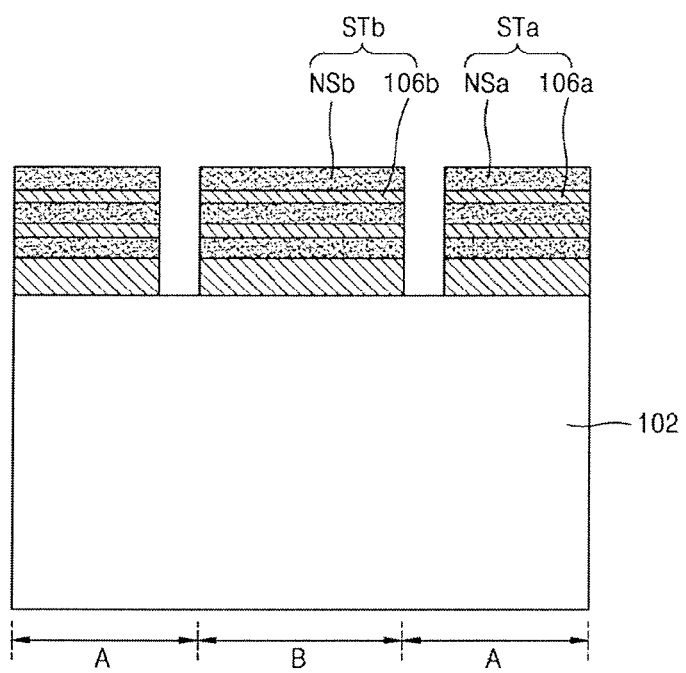

Referring to FIG. 7E, after the second stack structure STa is formed, the second mask pattern MP2 is removed. By removing the second mask pattern MP2, stack structures having different characteristics may be arranged in each area of the semiconductor substrate 102. For example, the second stack structure STa may be disposed on the semiconductor substrate 102 in the first area A and the first stack structure STb may be disposed on the semiconductor substrate 102 in the second area B.

Thereafter, the area of the substrate 102 from which the second mask pattern MP2 is removed may be filled with an insulating layer. Then, various other semiconductor processes may be performed to manufacture the semiconductor device 100 of FIGS. 1 through 2B. In the process of manufacturing the semiconductor device 100 of FIGS. 1 through 2B, the sacrificial semiconductor layers 106b of the first stack structure STb and the sacrificial semiconductor layers 106a of the second stack structure STa are removed. Here, according to the Ge concentration of the sacrificial semiconductor layers 106a and 106b, thicknesses of the remaining nano sheets may vary after the sacrificial semiconductor layers 106a and 106b are removed.

For example, compared to the sacrificial semiconductor layer 106b having a low Ge concentration, in the sacrificial semiconductor layer 106a having a high Ge concentration, a relatively higher amount of Ge may penetrate an adjacent semiconductor layer NSa by diffusion. Accordingly, outer portions of the semiconductor layers NSa which are adjacent to the sacrificial semiconductor layer 106a may be changed to have a quality similar to that of the sacrificial semiconductor layer 106a. During the process of removing the sacrificial semiconductor layer 106a, the outer portions of the semiconductor layers NSa may be removed together.

Also, outer portions of the semiconductor layers NSb which are adjacent to the sacrificial semiconductor layer 106b may be removed. However, the outer portions of the semiconductor layer NSb may be removed by a smaller degree than the outer portions of the semiconductor layer NSa. Accordingly, the nano sheets formed based on the semiconductor layer NSa, for example, the first nano sheets NS1 (refer to FIG. 2B) may be thinner than the nano sheets formed based on the semiconductor layer NSb, for example, the second nano sheet NS2 (refer to FIG. 2B).

For example, the sacrificial semiconductor layers 106a and 106b including SiGe may be removed by an etching method of an oxide layer. Thus, when the SiGe is oxidized, the Si may be oxidized by a smaller degree than the SiGe by using a proper oxidization method. This may be done to remove the sacrificial semiconductor layers 106a and 106b. Also, the sacrificial semiconductor layers 106a and 106b may be removed by repeatedly oxidizing and etching SiGe.

The process of manufacturing the semiconductor device 100 of FIGS. 1 through 2B will be described in more detail with reference to FIGS. 9 through 24.

Figure 8A:
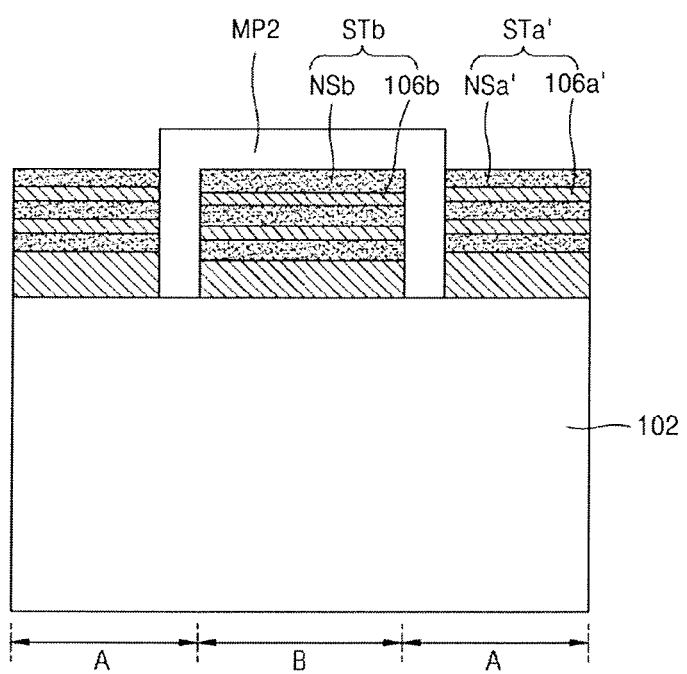
FIGS. 8A and 8B are cross-sectional views illustrating adjustment of a thickness of a nano sheet in each area of a substrate in a method of manufacturing a semiconductor device, according to exemplary embodiments of the inventive concept.
Figure 8B:
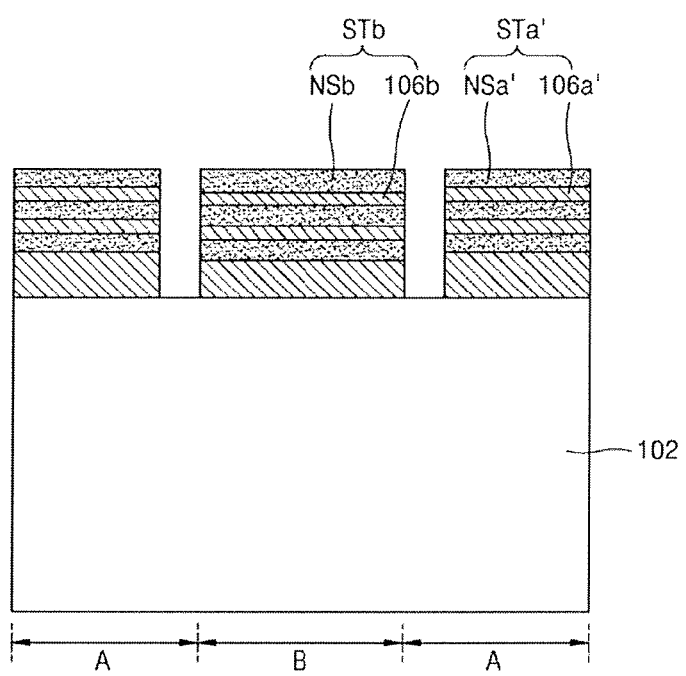

FIGS. 8A and 8B are cross-sectional views illustrating adjustment of a thickness of a nano sheet in each area of a substrate in a method of manufacturing a semiconductor device, according to exemplary embodiments of the inventive concept. The semiconductor device of FIG. 8A may correspond to the semiconductor device of FIG. 7D, and the semiconductor device of FIG. 8B may correspond to the semiconductor device of FIG. 7E.

Referring to FIG. 8A, the same process as the process described with reference to FIGS. 7A through 7C may be performed to form the first stack structure STb on the semiconductor substrate 102 in the second area B. The first stack structure STb may be surrounded by the second mask pattern MP2.

Then, a second stack structure STa', in which a plurality of sacrificial semiconductor layers 106a' and a plurality of semiconductor layers NSa' are alternately stacked one-by-one, is formed on the semiconductor substrate 102 in the first area A. The plurality of semiconductor layers NSa' may correspond to nano sheets. The sacrificial semiconductor layers 106a' and the semiconductor layers NSa' may be epitaxially grown. The sacrificial semiconductor layers 106a' and the semiconductor layers NSa' may include the same material as the sacrificial semiconductor layers 106b and the semiconductor layers NSb of the first stack structure STb. For example, the sacrificial semiconductor layers 106a' may include SiGe, and the semiconductor layers NSa' for nano sheets may include Si.

In the method of manufacturing the semiconductor device, according to an exemplary embodiment of the inventive concept, the sacrificial semiconductor layers 106a' and the semiconductor layers NSa' included in the second stack structure STa' may be formed to have a different thickness than the sacrificial semiconductor layers 106b and the semiconductor layers NSb included in the first stack structure STb. For example, the semiconductor layers NSa' of the second stack structure STa' may be formed to be thinner than the semiconductor layers NSb of the first stack structure STb. The semiconductor layers NSa' may be formed to have a thickness that takes into account, for example, removing or annealing the sacrificial semiconductor layers 106a' to achieve a final desired thickness of the nano sheets. In addition, the semiconductor layers NSa' may have a thickness such that a quantum confinement effect may occur due to the final nano sheets.

The sacrificial semiconductor layers 106a' may be formed to be thinner or thicker than the sacrificial semiconductor layers 106b of the first stack structure STb. For example, a lowermost sacrificial semiconductor layer 106a' may be formed to be thicker than the lowermost sacrificial layer 106b of the first stack structure STb. Also, upper sacrificial semiconductor layers 106a' may be formed to be thicker than the upper sacrificial semiconductor layers 106b of the first stack structure STb. The sacrificial semiconductor layers 106a' may be formed to have a thickness such that the semiconductor layers NSa' may be located at a similar height with respect to the substrate 102 as the semiconductor layers NSb of the corresponding first stack structure STb.

When the sacrificial semiconductor layers 106a' include SiGe, the sacrificial semiconductor layers 106a' may be formed such that Ge is included as a first concentration. For example, the Ge concentration of the sacrificial semiconductor layers 106a' and the Ge concentration of the sacrificial semiconductor layers 106b of the first stack structure STb may be substantially the same. However, like the first stack structure STb, the Ge concentration of the lowermost sacrificial semiconductor layer 106a' and the Ge concentration of the upper sacrificial semiconductor layers 106a' may be different from each other. For example, the lowermost sacrificial layer 106a' may have a Ge concentration of about 20% by weight, and the upper sacrificial semiconductor layers 106a' may have a Ge concentration of about 30% by weight. However, the Ge concentrations of the lowermost sacrificial semiconductor layer 106a' and the upper sacrificial semiconductor layers 106a' may also be the same as each other.

Referring to FIG. 8B, after the second stack structure STa' is formed, the second mask pattern MP2 is removed. By removing the second mask pattern MP2, stack structures having different characteristics may be disposed on each area of the semiconductor substrate 102. For example, the second stack structure STa' may be disposed on the semiconductor substrate 102 in the first area A and the first stack structure STb may be disposed on the semiconductor substrate 102 in the second area B.

Then, a portion of the substrate 102 from which the second mask pattern MP2 is removed may be filled with an insulating layer. Then, various other semiconductor processes may be performed to manufacture the semiconductor device 100 of FIGS. 1 through 2B. In the process of manufacturing the semiconductor device 100 of FIGS. 1 through 2B, the sacrificial semiconductor layers 106b of the first stack structure STb and the sacrificial semiconductor layers 106a' of the second stack structure STa are removed. Here, since the semiconductor layers NSb and NSa' of the first stack structure STb and the second stack structure STa' have different thicknesses, thicknesses of nano sheets remaining after the sacrificial semiconductor layers 106a' and 106b are removed may be different. For example, after the sacrificial semiconductor layers 106a' and 106b are removed, nano sheets formed by the semiconductor layer NSa', for example, the first nano sheets NS1 (refer to FIG. 2B) may be thinner than nano sheets formed by the semiconductor layer NSb, for example, the second nano sheets NS2 (refer to FIG. 2B).

FIGS. 9 through 24 are cross-sectional views illustrating a process of manufacturing a semiconductor device, according to exemplary embodiments of the inventive concept. The cross-sectional views illustrated in FIGS. 9 through 24 correspond to the cross-sectional views of FIG. 2A or 2B.

Figure 9:
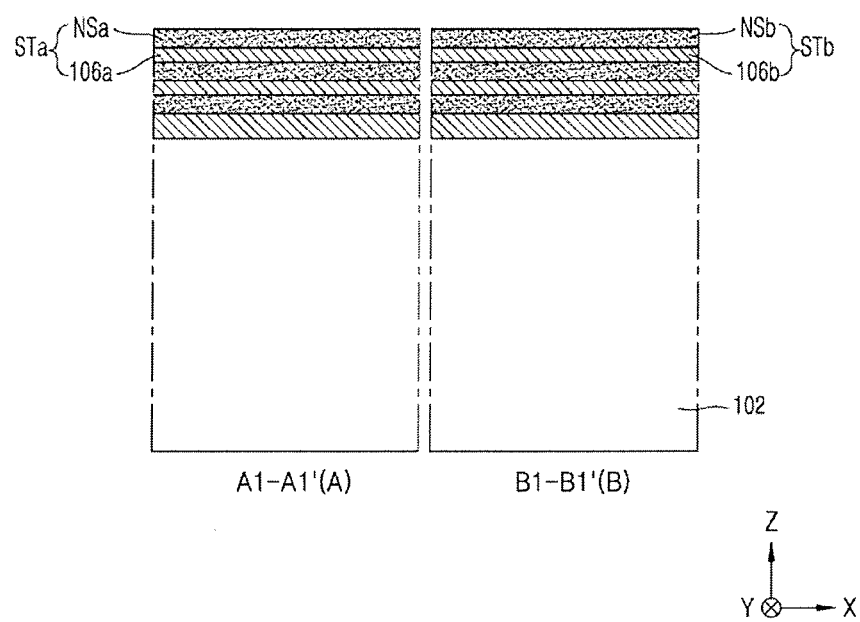
FIGS. 9 through 24 are cross-sectional views illustrating a process of manufacturing a semiconductor device, according to exemplary embodiments of the inventive concept.

Referring to FIG. 9, the second stack structure STa is formed on the semiconductor substrate 102 in the first area A, and the first stack structure STb is formed on the semiconductor substrate 102 in the second area B, using the process described with reference to FIGS. 7A through 7E. As described with reference to FIGS. 7A through 7E, the second stack structure STa may include the sacrificial semiconductor layers 106a and the semiconductor layers NSa. The first stack structure STb may include the sacrificial semiconductor layers 106b and the semiconductor layers NSb.

The sacrificial semiconductor layer 106a and the semiconductor layer NSa of the second stack structure STa may be formed to have the same thickness as the sacrificial semiconductor layer 106b and the semiconductor layer NSb of the first stack structure STb. Also, the sacrificial semiconductor layer 106a of the second stack structure STa may have a higher Ge concentration than the sacrificial semiconductor layer 106b of the first stack structure STb.

Figure 10A:
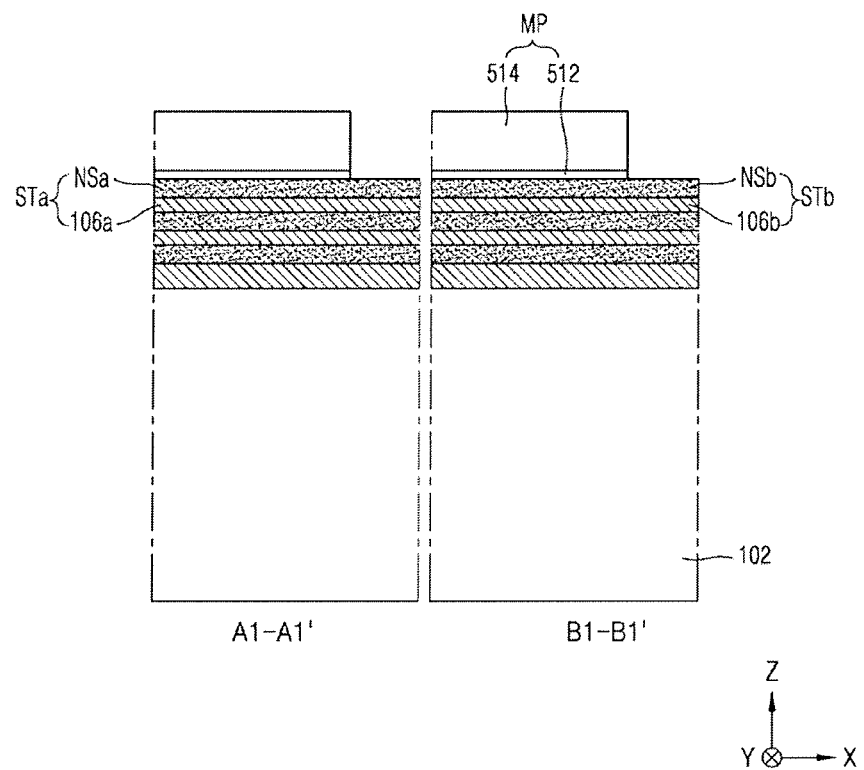
Figure 10B:
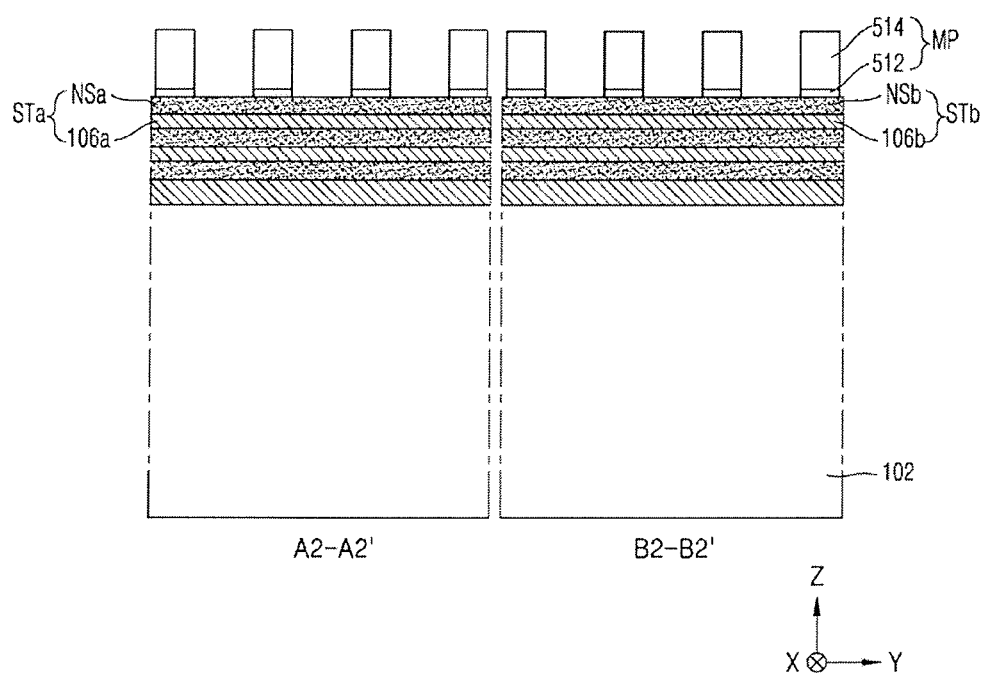

Referring to FIGS. 10A and 10B, a mask pattern MP may be formed on the first stack structure STb and the second stack structure STa. For example, the mask pattern MP may be formed on the semiconductor layer NSb of the first stack structure STb and the semiconductor layer NSa of the second stack structure STa.

The mask pattern MP may include a plurality of line patterns extending in parallel to one another in the first direction (the X direction). The mask pattern MP may include a pad oxide layer pattern 512 and a hard mask pattern 514. The hard mask pattern 514 may include silicon nitride, polysilicon, an SOH material, or a combination thereof. However, materials of the hardmask pattern 514 are not limited thereto.

Figure 11A:
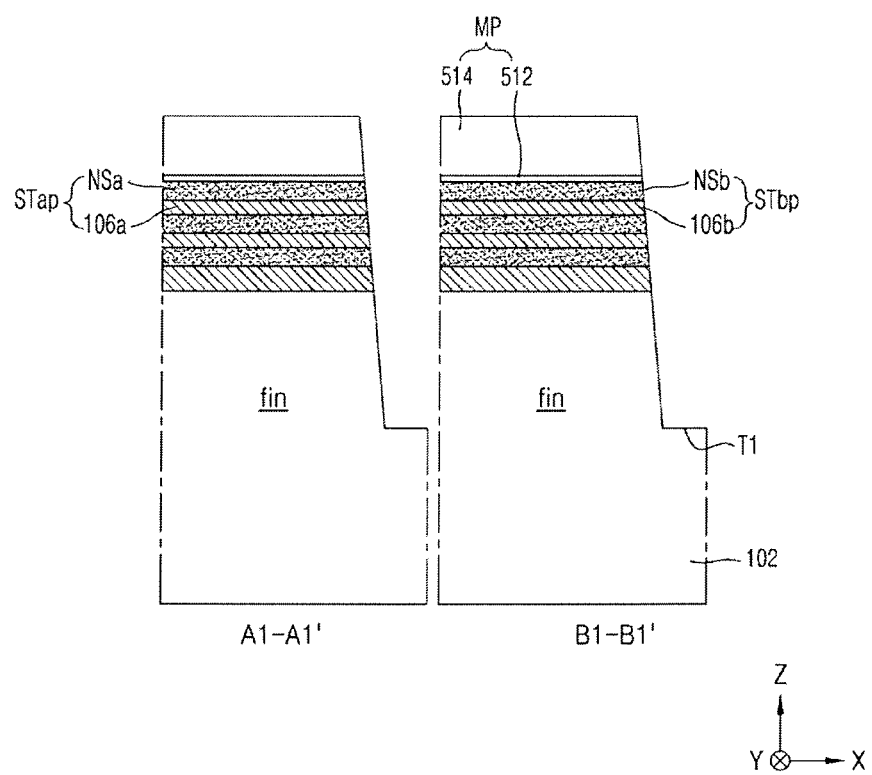
Figure 11B:
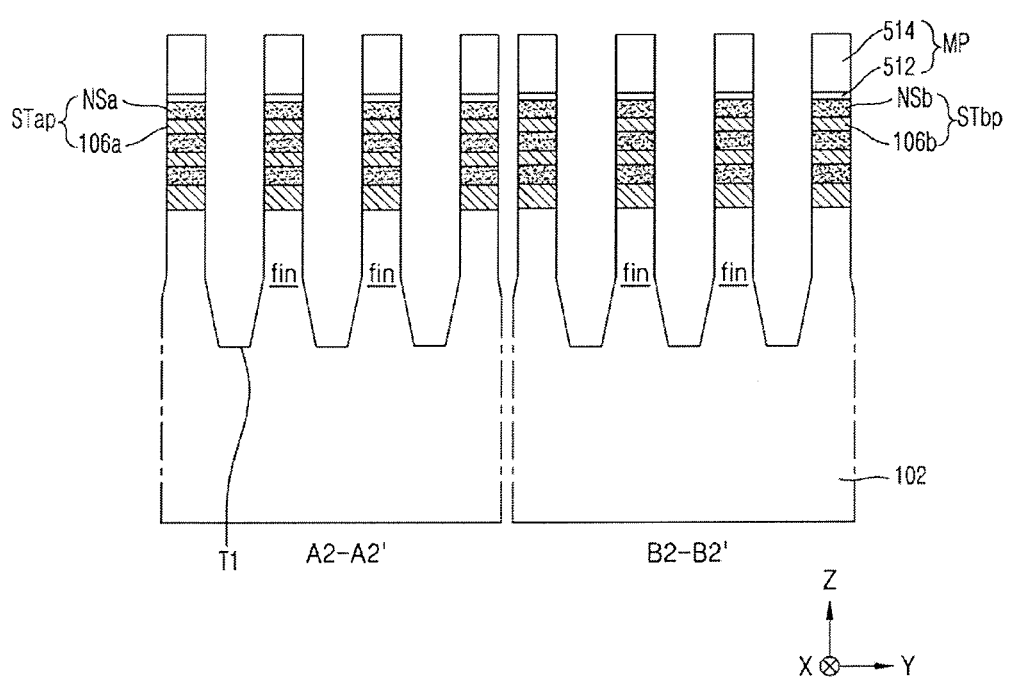

Referring to FIGS. 11A and 11B, a plurality of first trenches T1 may be formed by partially etching the first stack structure STb, the second stack structure STa, and the substrate 102, by using the mask pattern MP as an etch mask. A plurality of fins may be formed by the formation of the first trenches T1.

After the fins are formed, stack structure patterns STap and STbp may be formed on the fins, respectively. For example, the second stack structure pattern STap may be formed on each of the fins in the first area A, and the first stack structure pattern STbp may be formed on each of the fins in the second area B.

Figure 12A:
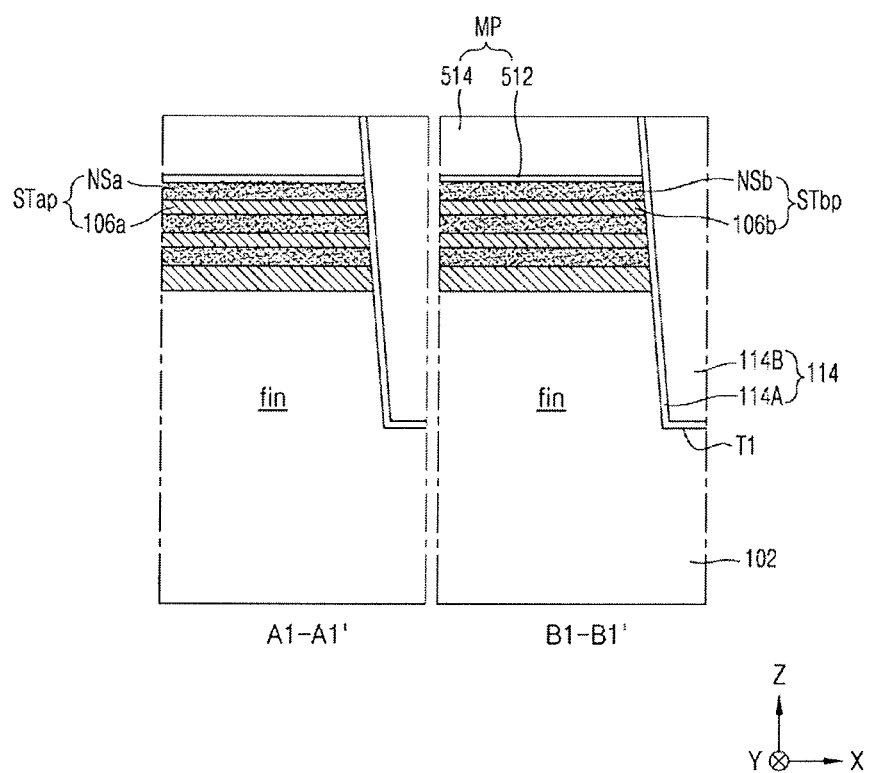
Figure 12B:
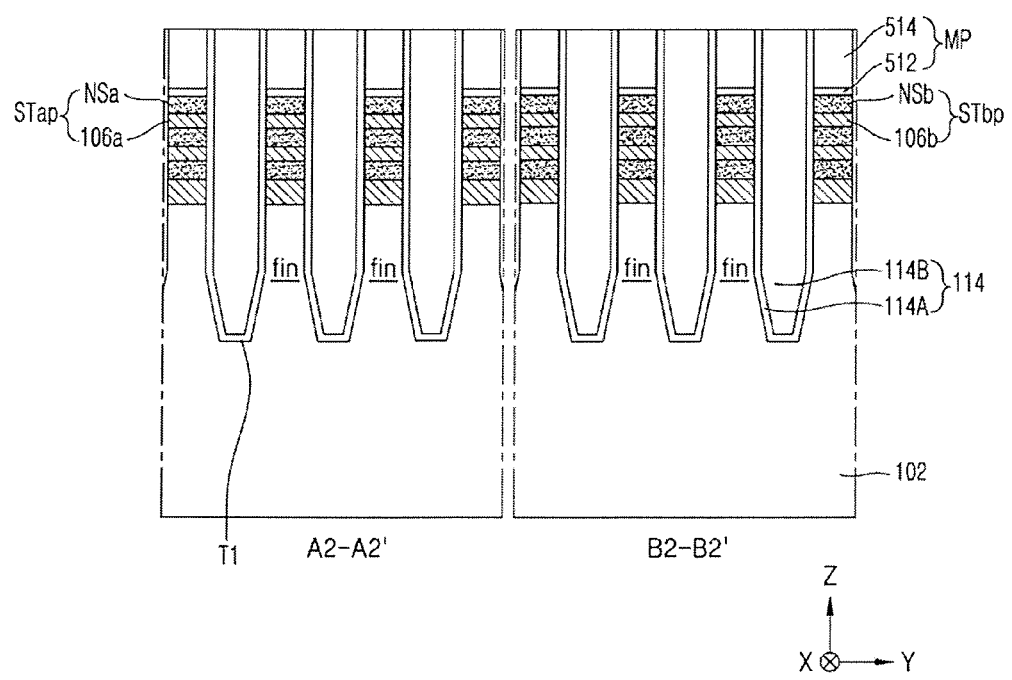

Referring to FIGS. 12A and 12B, the STI layer 114 including the insulating liner 114A and the gap-fill insulating layer 114B may be formed in the first trenches T1. Materials of the insulating liner 114A and the gap-fill insulating layer 114B are as described with reference to FIGS. 1 through 2B.

Figure 13A:
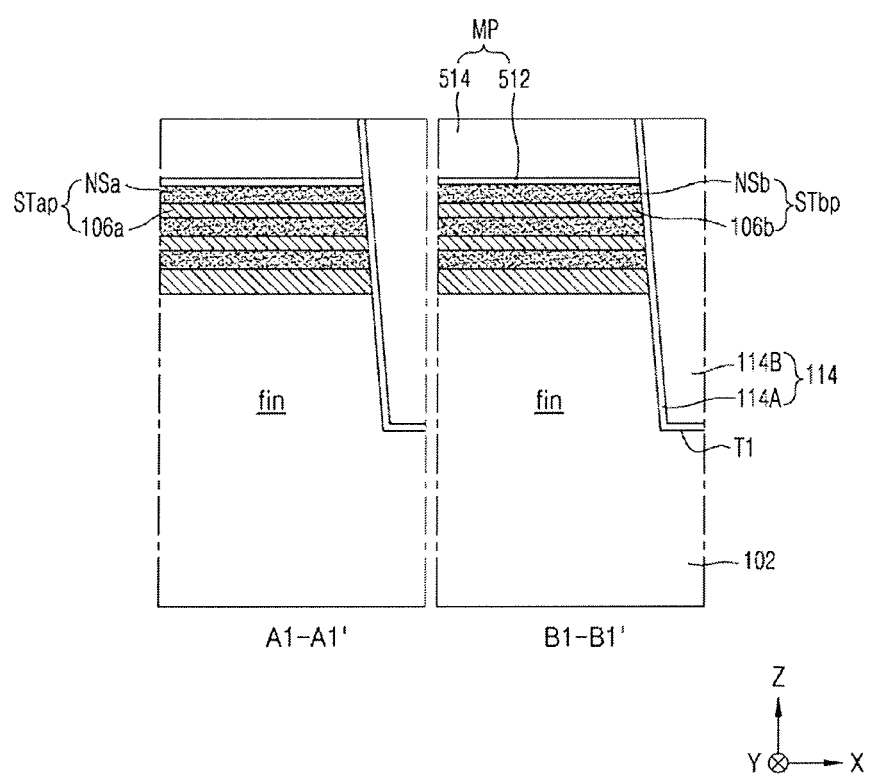
Figure 13B:
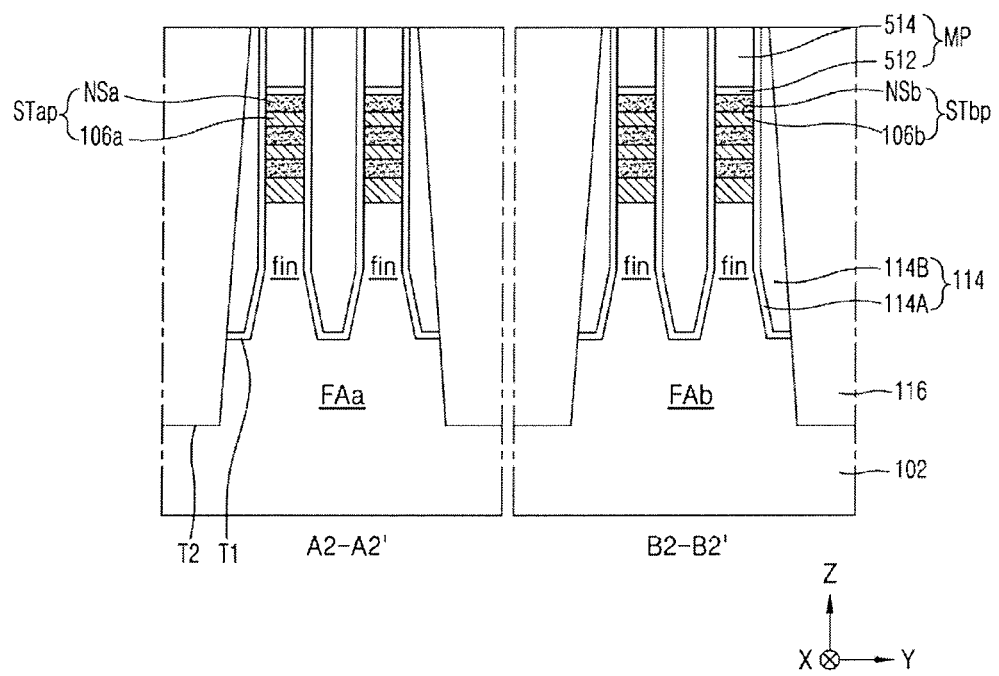

Referring to FIGS. 13A and 13B, a second trench T2, defining a boundary of the device area DR (refer to FIG. 1), may be formed by etching some of the fins and the STI layer 114. By forming the device area DR, a boundary of the fin activation areas FAa and FAb may also be defined. For example, the first fin activation area FAa including two fins may be located in the first area A and the second fin activation area FAb including two fins may be located in the second area B.

The device separating layer 116 may be formed by filling the second trenches T2 with an insulating material. Materials of the device separating layer 116 are as described with reference to FIGS. 1 through 2B.

Figure 14A:
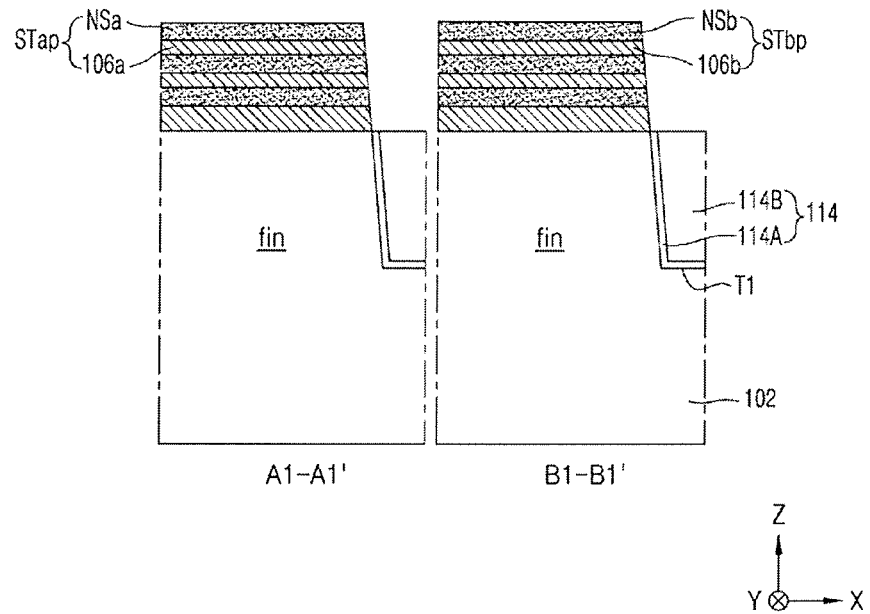
Figure 14B:
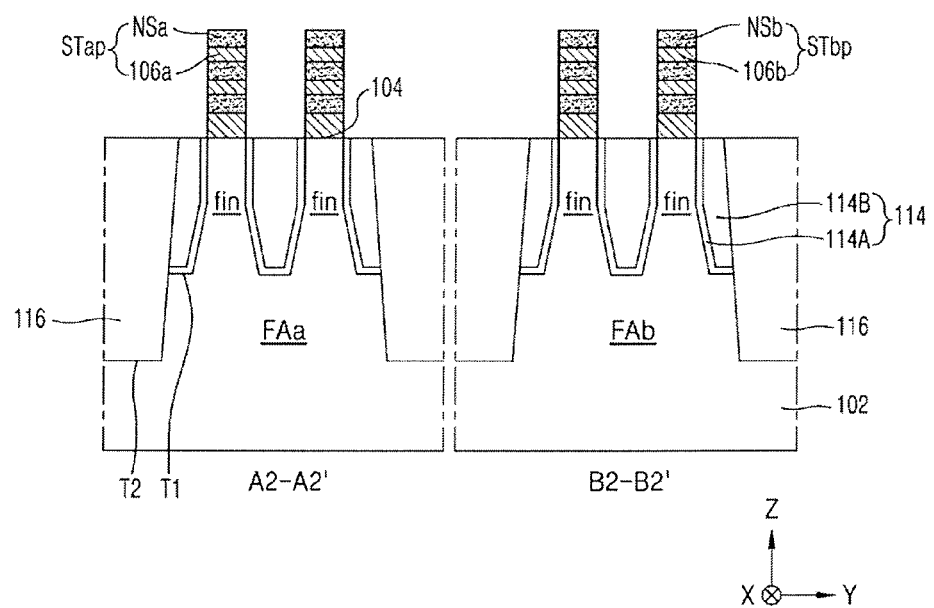

Referring to FIGS. 14A and 14B, the mask pattern MP remaining on the first stack structure pattern STbp and the second stack structure pattern STap may be removed, and upper portions of the STI layer 114 and the device separating layer 116 may be removed by a recess process. To perform the recess process, dry etching, wet etching, or a combination of dry etching and wet etching may be used. By the recess process, the upper surface of each of the STI layer 114 and the device separating layer 116 may have substantially the same height as the upper surface 104 of the fin activation areas FAa and FAb. After the recess process, side walls of the first stack structure pattern STbp and the second stack structure pattern STap on the fin activation areas FAa and FAb may be exposed.

In an exemplary embodiment of the inventive concept, after the mask pattern MP is removed, an ion injection process for injecting impurity ions for adjusting threshold voltage into the semiconductor layers NSa and NSb and upper portions of the fin activation areas FAa and FAb may be performed before the recess process is performed on the STI layer 114 and the device separating layer 116. In an exemplary embodiment of the inventive concept, during the ion injection, a boron (B) ion may be injected as an impurity into an area in which an NMOS transistor is formed, and a phosphorous (P) or an arsenic (As) ion may be injected as an impurity into an area in which a PMOS transistor is formed.

Figure 15A:
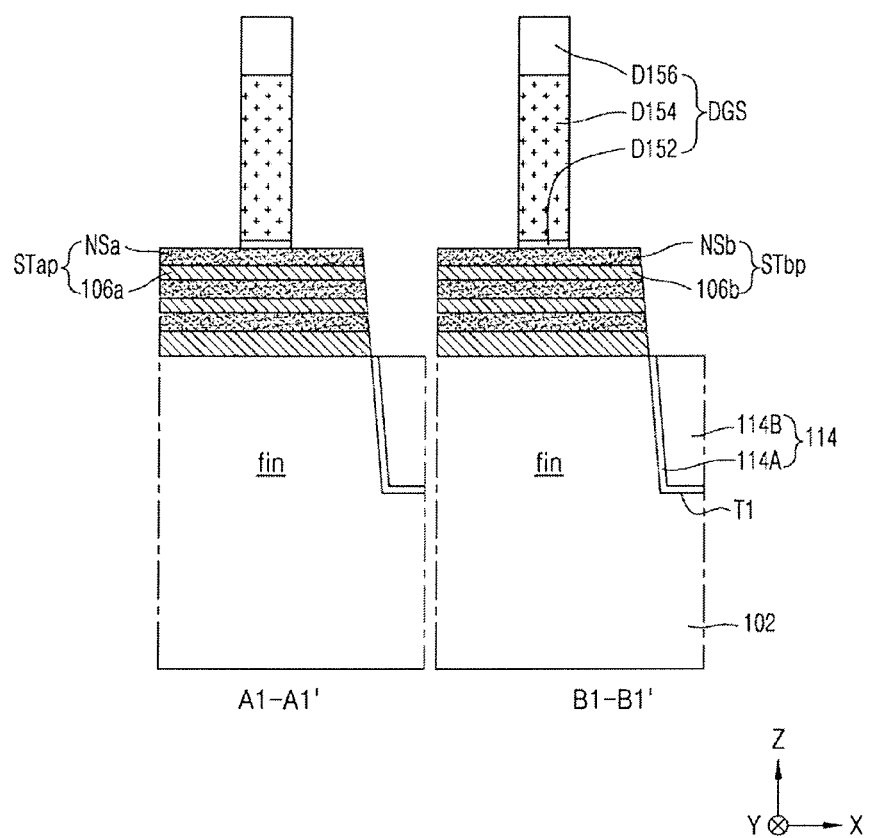
Figure 15B:
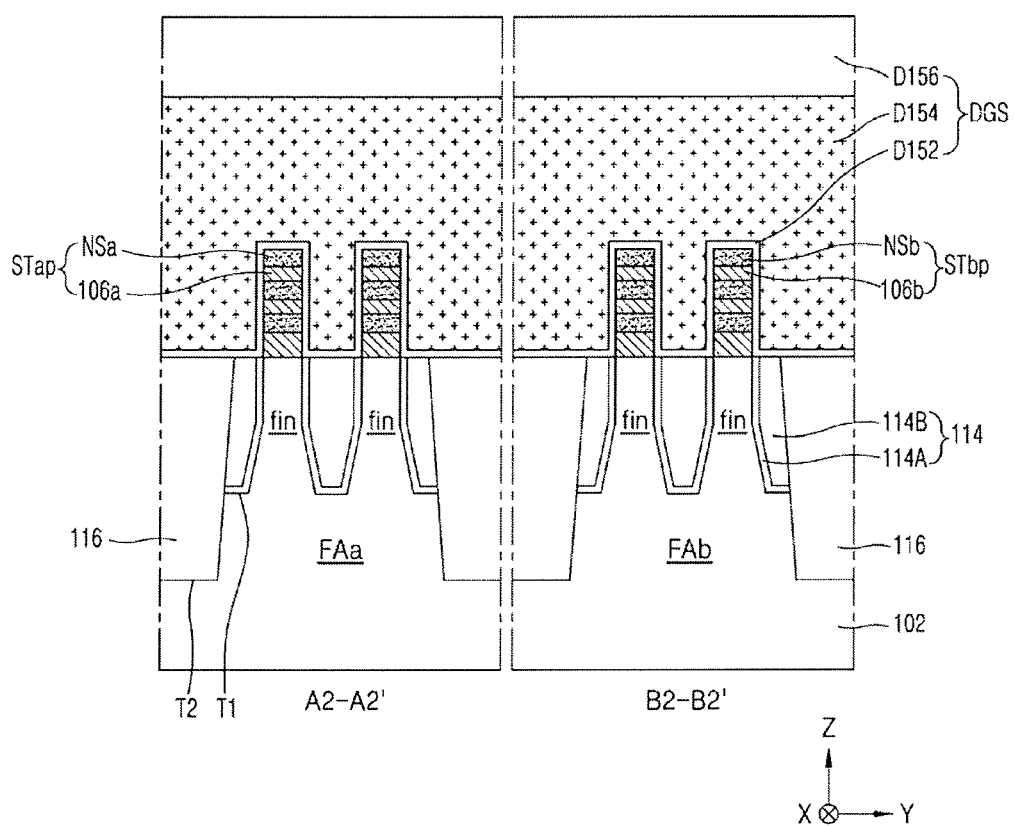

Referring to FIGS. 15A and 15B, a plurality of dummy gate structures DGS may be formed on the fin activation areas FAa and FAb to extend across the fins. The dummy gate structure DGS may have a structure in which an oxide layer D152, a dummy gate layer D154, and a capping layer D156 are sequentially stacked.

When forming the dummy gate structure DGS, the oxide layer D152, the dummy gate layer D154, and the capping layer D156 may be sequentially formed to cover exposed surfaces of the stack structure patterns STap and STbp, covering the fin activation areas FAa and FAb, covering an upper surface of the STI layer 114, and covering an upper surface of the device separating layer 116. Then, the oxide layer D152, the dummy gate layer D154, and the capping layer D156 may be patterned to make the oxide layer D152, the dummy gate layer D154, and the capping layer D156 remain only where needed. The dummy gate structure DGS may be formed to have a plan view shape corresponding to the plan view shape of the first and second gate electrodes 150a and 150b illustrated in FIG. 1.

In an exemplary embodiment of the inventive concept, the dummy gate layer D154 may include polysilicon and the capping layer D156 may include a silicon nitride layer. However, materials of the dummy gate layer D154 and the capping layer D156 are not limited thereto.

Figure 16:
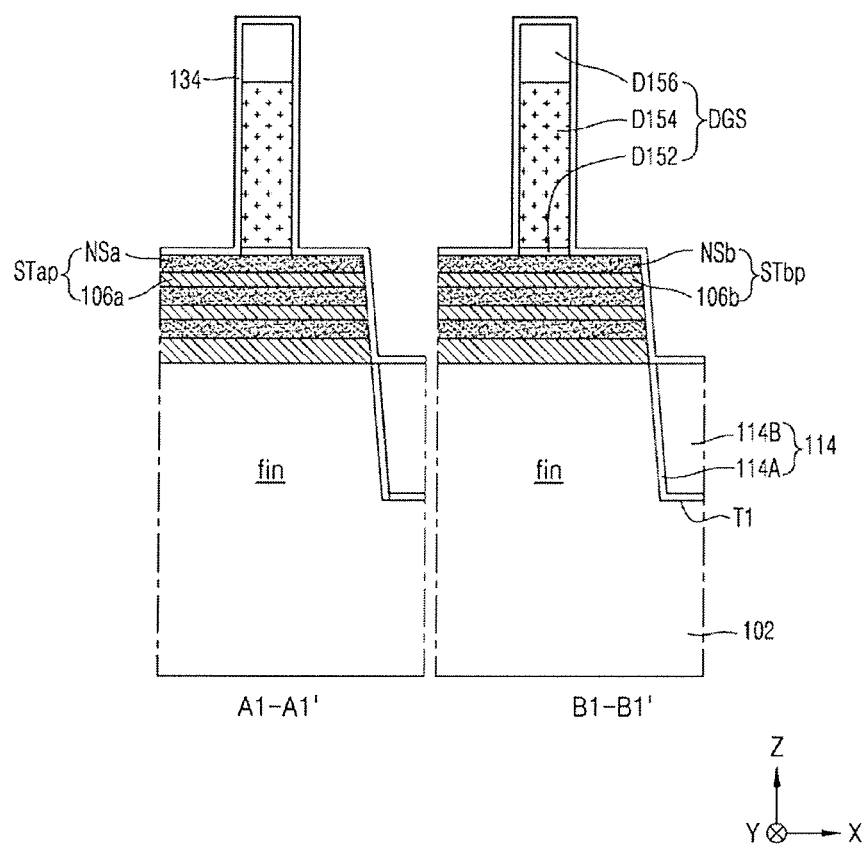

Referring to FIG. 16, the insulating liner 134 may be formed to cover the exposed surface of the dummy gate structure DGS, the exposed surface of the stack structure patterns STap and STbp, and the upper surfaces of the STI layer 114 and the device separating layer 116. In an exemplary embodiment of the inventive concept, the insulating liner 134 may include a silicon nitride layer.

In an exemplary embodiment of the inventive concept, after the insulating liner 134 is formed, a halo implantation region may be formed in the semiconductor layers NSa and NSb by injecting impurity ions into the semiconductor layers NSa and NSb. In order to form the halo implantation region, a boron (B) ion may be injected as an impurity into an area in which an NMOS transistor is formed, and a phosphorus (P) or an arsenic (As) ion may be injected as an impurity into an area in which a PMOS transistor is formed.

FIG. 16 is a cross-sectional view corresponding to the cross-sectional view of FIG. 2A, and a cross-sectional view corresponding to the cross-sectional view of FIG. 2B is omitted. The omitted cross-sectional view corresponding to the cross-sectional view of FIG. 2B would show a semiconductor device which has a structure in which the insulating liner 134 is formed on the capping layer D156, and otherwise be exactly the same as the semiconductor device illustrated in FIG. 15B.

Figure 17:
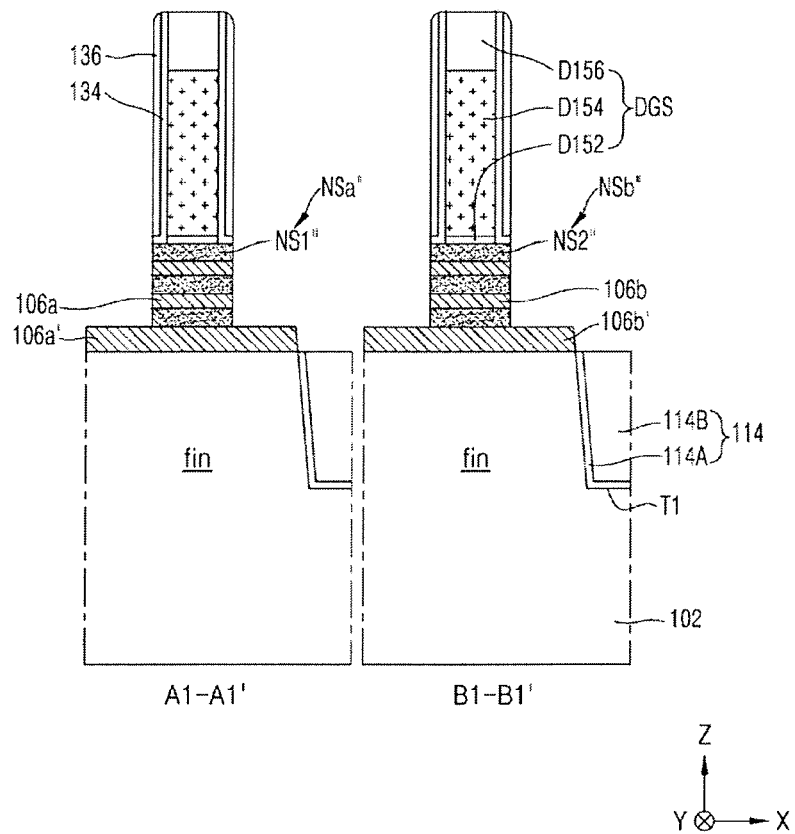

Referring to FIG. 17, a first insulating spacer 136 covering both side walls of the dummy gate structure DGS may be formed, and portions of the stack structure patterns STap and STbp may be etched and removed by using the dummy gate structure DGS and the first insulating spacer 136 as an etch mask. Accordingly, a stack structure NSa" including three first nano sheets NS1" and a stack structure NSb" including three second nano sheets NS2" may be formed. Two stack structures NSa" of the first area A and two stack structures NSb" of the second area B may be formed to correspond to the two fins located in the first area A and the second area B.

To form the first insulating spacer 136, a spacer layer including a silicon nitride layer may be formed on the structure of FIG. 16 on which the insulating liner 134 is formed. Then, the spacer layer 136 may be etched back to make the spacer layer 136 remain only at side walls of the dummy gate structure DGS (e.g., both side walls of the dummy gate structure DGS).

When the stack structure patterns STap and STbp are etched, a point in time at which the lowermost sacrificial semiconductor layers 106a' and 106W of the sacrificial semiconductor layers 106a and 106b are exposed may be determined as an etch end time. Accordingly, after the stack structures NSa" and NSb" are formed, the lowermost sacrificial semiconductor layers 106a' and 106b' covering the fin activation areas FAa and FAb may be exposed between the stack structures NSa" and NSb". Also, after the stack structures NSa" and NSb" are formed, the sacrificial semiconductor layers 106a, 106a', 106b, and 106b' may remain between the fin activation areas FAa and FAb and the stack structures NSa" and NSb", and between the nano sheets NS1" and NS2".

In the structure of FIG. 17, a cross-sectional view of the semiconductor device corresponding to the cross-sectional view of FIG. 2B may be substantially the same as the cross-sectional view of FIG. 15B. In addition, in the structures of FIGS. 18, and 20 through 22, cross-sectional views of the semiconductor device corresponding to the cross-sectional view of FIG. 2B may be substantially the same as the cross-sectional view of FIG. 15B. In FIG. 19, the cross-sectional view of the semiconductor device corresponding to the cross-sectional view of FIG. 2B has a structure in which the second insulating spacer 140 (refer to FIG. 19) is formed on the capping layer D156 of FIG. 15B, and would otherwise be exactly the same as the semiconductor device shown in FIG. 15B.

Figure 18:
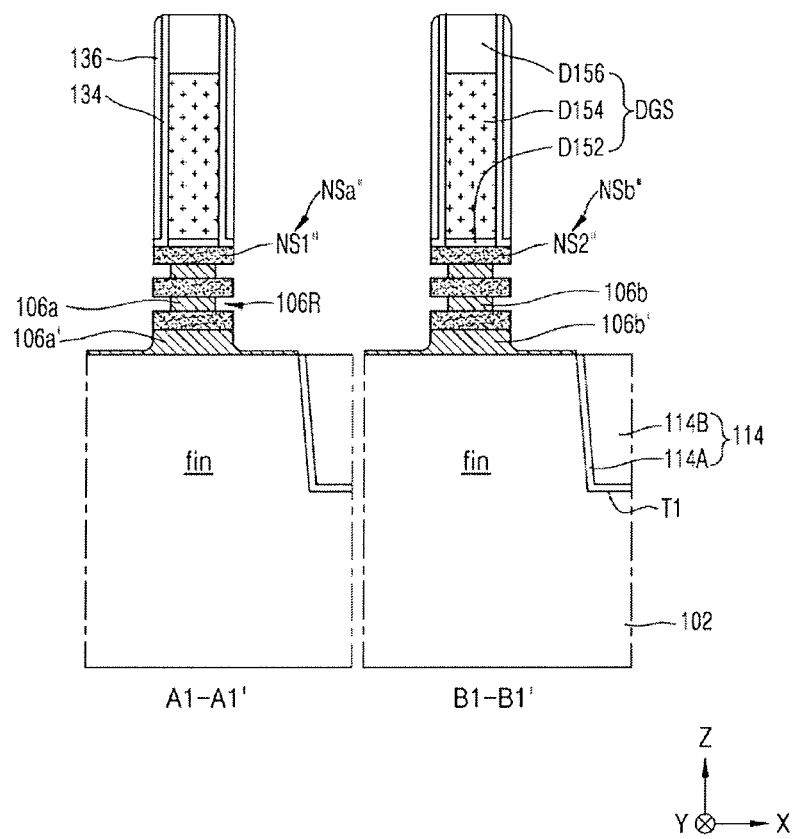
Figure 19:
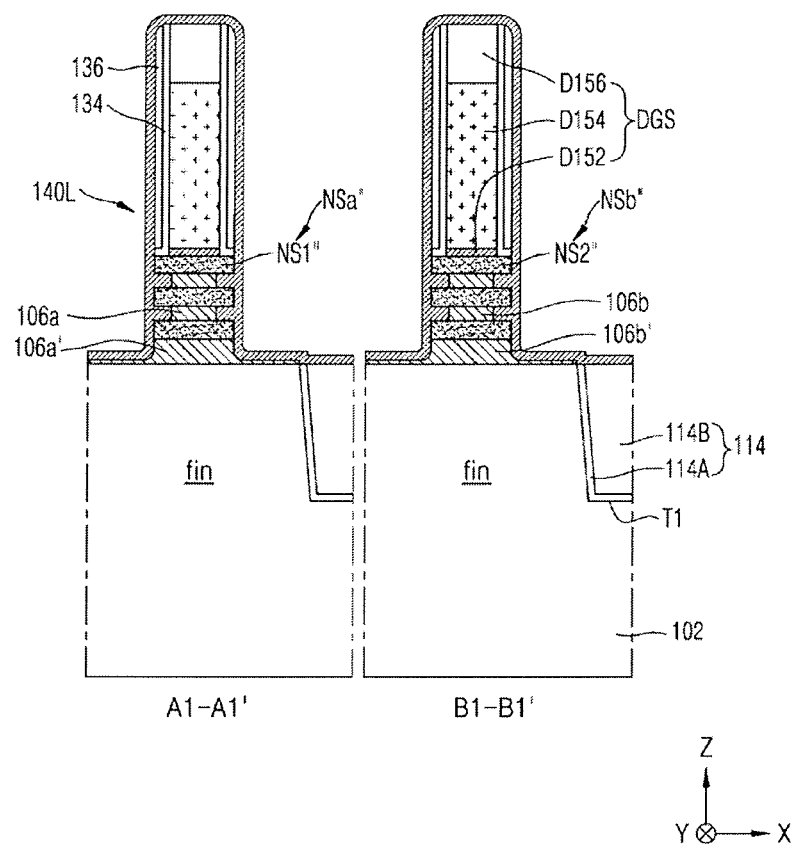

Referring to FIG. 18, recess areas 106R may be formed between the nano sheets NS1" and NS2" by partially removing the sacrificial semiconductor layers 106a and 106b exposed at both sides of the stack structures NSa" and NSb" by using isotropic etching. When the recess areas 106R are formed, an exposed portion of the lowermost sacrificial semiconductor layers 106a' and 106W covering the fin activation area FAa and FAb between the stack structures NSa" and NSb" may be partially removed. Thus, the lowermost sacrificial semiconductor layers 106a' and 106b' may become thinner.

In an exemplary embodiment of the inventive concept, an isotropic etching for forming the recess areas 106R may be performed by a wet etching that uses an etch selectivity difference between the sacrificial semiconductor layers 106a, 106a', 106b, and 106b' and the nano sheets NS1" and NS2".

Referring to FIG. 19, an insulating structure 140L may be formed to fill the recess areas 106R (refer to FIG. 18) formed between the nano sheets NS1" and NS2". The insulating structure 140L may cover an upper surface of the dummy gate structure DGS, the first insulating spacer 136, and an upper surface of the lowermost sacrificial semiconductor layers 106a' and 106b'. The insulating structure 140L may include the second insulating spacer 140 (refer to FIG. 20) filling the recess areas 106R (refer to FIG. 18).

In an exemplary embodiment of the inventive concept, the insulating structure 140L may include a plurality of insulating layers.

Figure 20:
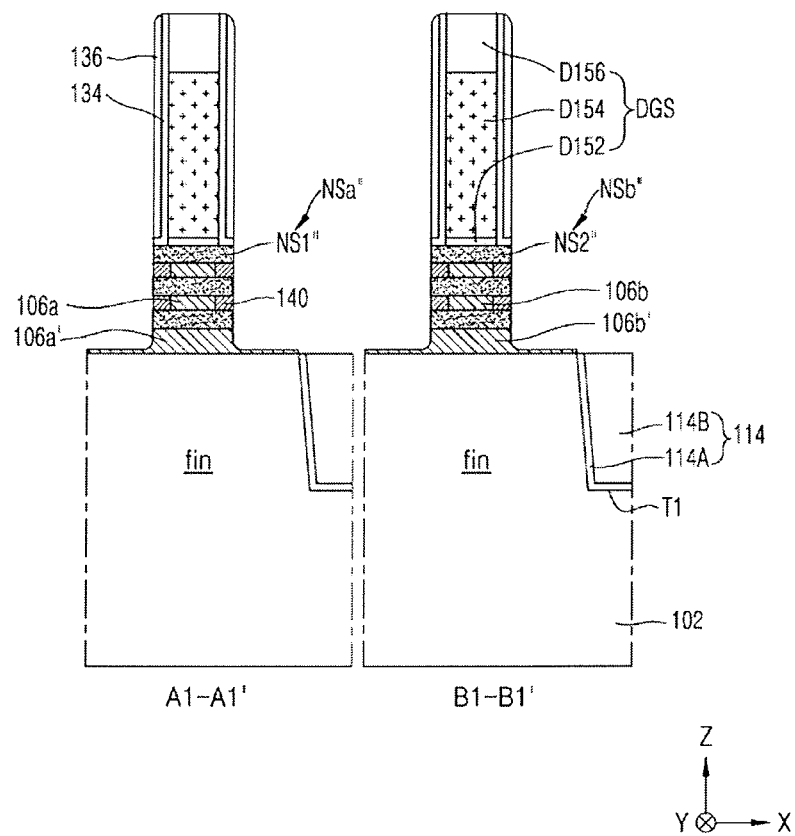

Referring to FIG. 20, the second insulating spacer 140 filling the recess areas 106R (refer to FIG. 18) may be formed by removing a portion of the insulating structure 140L (refer to FIG. 19) which is disposed outside the recess areas 106R.

Figure 21:
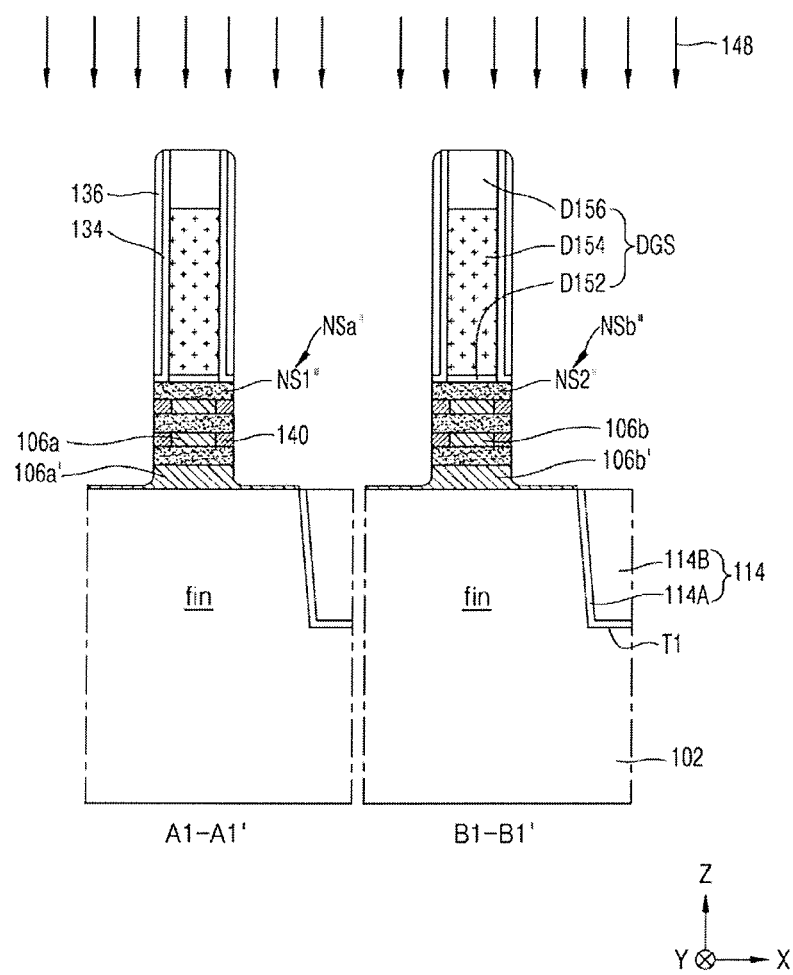

Referring to FIG. 21, exposed side walls of the nano sheets NS1" and NS2" and an exposed surface of the lowermost sacrificial semiconductor layers 106a' and 106b' are exposed to a cleaning atmosphere 148 to remove a native oxide layer from the exposed surfaces. In an exemplary embodiment of the inventive concept, the cleaning atmosphere 148 may include a first cleaning process using wet cleaning, a second cleaning process using a SiCoNi™ etching process, or a combination thereof. During the wet cleaning process, a diluted HF (DHF), $NH_4OH$, tetramethyl ammonium hydroxide (TMAH), or potassium hydroxide (KOH) solution, or the like, may be used. The SiCoNi™ etching process may be performed by using the hydrogen of $NH_3$ and the fluorine of $NF_3$.

During the cleaning process for removing the native oxide layer, insulating layers included in the second insulating spacer 140, for example, the insulating layers exposed to the cleaning atmosphere 148, may include materials having etching resistance with respect to the cleaning atmosphere 148. Accordingly, the second insulating spacer 140 may not be consumed or etched away when the native oxide layer is removed by the cleaning atmosphere 148. The materials included in the second insulating spacer 140 are described with reference to FIGS. 1 through 2B.

Figure 22:
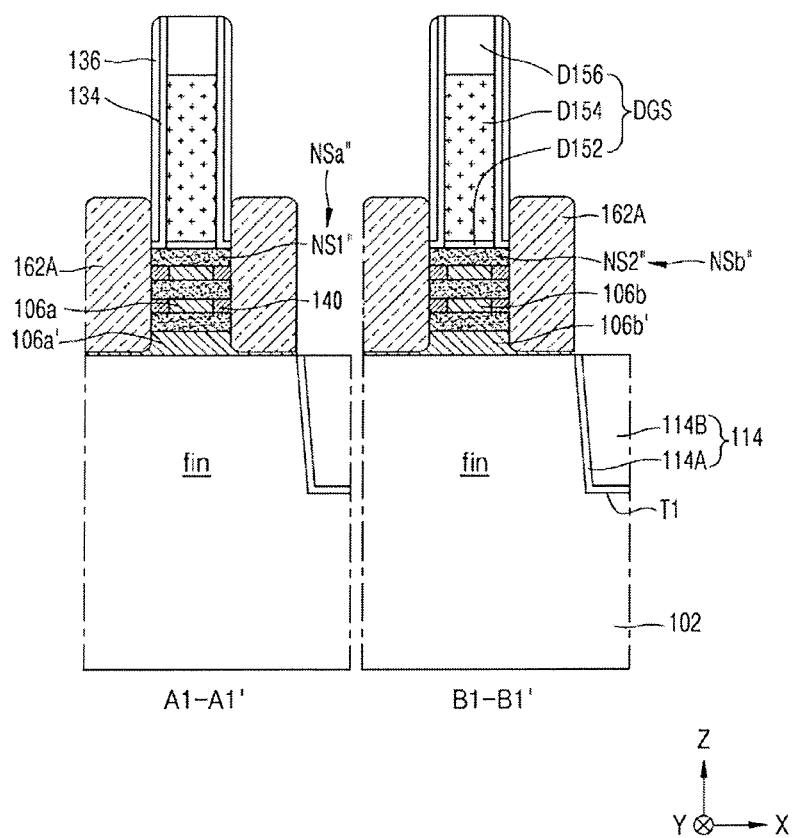

Referring to FIG. 22, a semiconductor material may be epitaxially grown from the exposed side walls of the nano sheets NS1" and NS2" from which the native oxide layer is removed to form the semiconductor layer 162A. The semiconductor layer 162A may form the source/drain areas 162a and 162b (refer to FIG. 2A).

As described with reference to FIGS. 1 through 2B, the first insulating spacer 136 includes an insulating layer on a surface of which a semiconductor element may not be seeded or epitaxially grown, and the second insulating spacer 140 includes an insulating layer on which at least a portion of the semiconductor element may be seeded and epitaxially grown. Thus, the epitaxial growing process for forming the semiconductor layer 162A may be performed not only on the exposed side walls of the nano sheets NS1" and NS2" but also on the surface of the second insulating spacer 140. Thus, the forming of the semiconductor layer 162A may be fostered, and the semiconductor layer 162A may be formed without voids and the semiconductor layer 162A may be formed to have a good quality.

Then, the protection layer 138 (refer to FIG. 23), covering a structure in which the semiconductor layer 162A is formed is formed. The inter-gate insulating layer 172 (refer to FIG. 23) may be formed on the protection layer 138. The inter-gate insulating layer 172 may then be planarized to expose an upper surface of the capping layer D156. Then, the capping layer D156, the insulating liner 134, the first insulating spacer 136, and the protection layer 138 around the capping layer D156 may be etched back, and the inter-gate insulating layer 172 may be polished at an upper portion thereof by a given thickness so that an upper surface of the inter-gate insulating layer 172 is at approximately the same level as an upper surface of the dummy gate layer D154.

Figure 23:
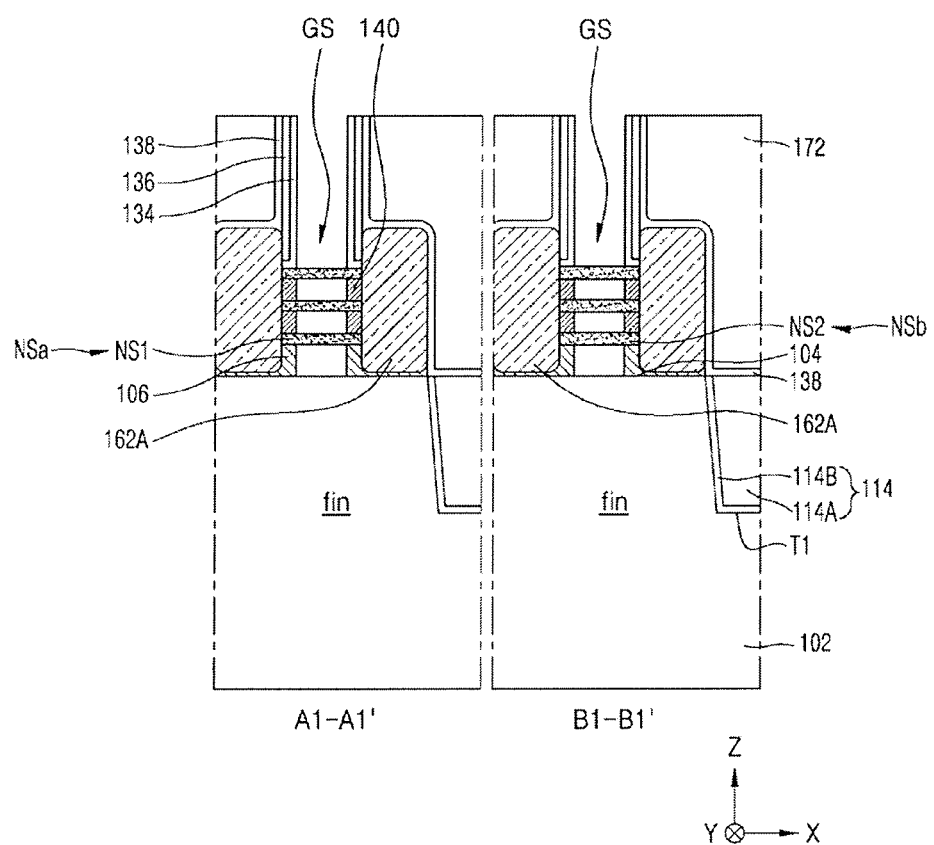

Referring to FIG. 23, the nano sheets NS1" and NS2" are exposed by a gate space GS, and the gate space GS may be formed by removing the exposed dummy gate layer D154 and the oxide layer D152 below the dummy gate layer D154. A portion of the sacrificial semiconductor layers 106a and 106b remaining on the fin activation areas FAa and FAb may be removed when forming the gate space GS. The nano sheets NS1" and NS2" and the upper surface 104 of the fin activation areas FAa and FAb may be partially exposed by the gate space GS.

The lowermost sacrificial semiconductor layers 106a' and 106W of the sacrificial semiconductor layers 106a and 106b may not be completely removed, and portions of the lowermost sacrificial semiconductor layers 106a' and 106W may remain between the second insulating spacer 140 and the fin activation areas FAa and FAb. The remaining portions of the lowermost sacrificial semiconductor layers 106a' and 106W on the fin activation areas FAa and FAb may be included in the buffer semiconductor layer 106.

The first nano sheets NS1 and the second nano sheets NS2 may be formed by removing the sacrificial semiconductor layers 106a and 106b. Three first nano sheets NS1 and three second nano sheets NS2 may be included in the stack structures NSa and NSb, respectively. As described with reference to FIGS. 7A through 7E, due to the difference of the Ge concentration of the sacrificial semiconductor layers 106a and 106b, a thickness of the first nano sheet NS1 may be smaller than a thickness of the second nano sheet NS2 after the sacrificial semiconductor layers 106a, 106a', 106b, and 106W are removed.

In a structure of a semiconductor device corresponding to the process of FIG. 23, when taking a cross-sectional view as illustrated in FIG. 2B, only the nano sheets NS1 and NS2 on the fin activation areas FAa and FAb would exist (e.g., be illustrated), and there would be no first and second gate electrodes 150a and 150b, no gate insulating layer 145, and no interlayer insulating layer 174 illustrated. This is because the first and second gate electrodes 150a and 150b, the gate insulating layer 145, and the interlayer insulating layer 174 are not yet formed.

Figure 24:
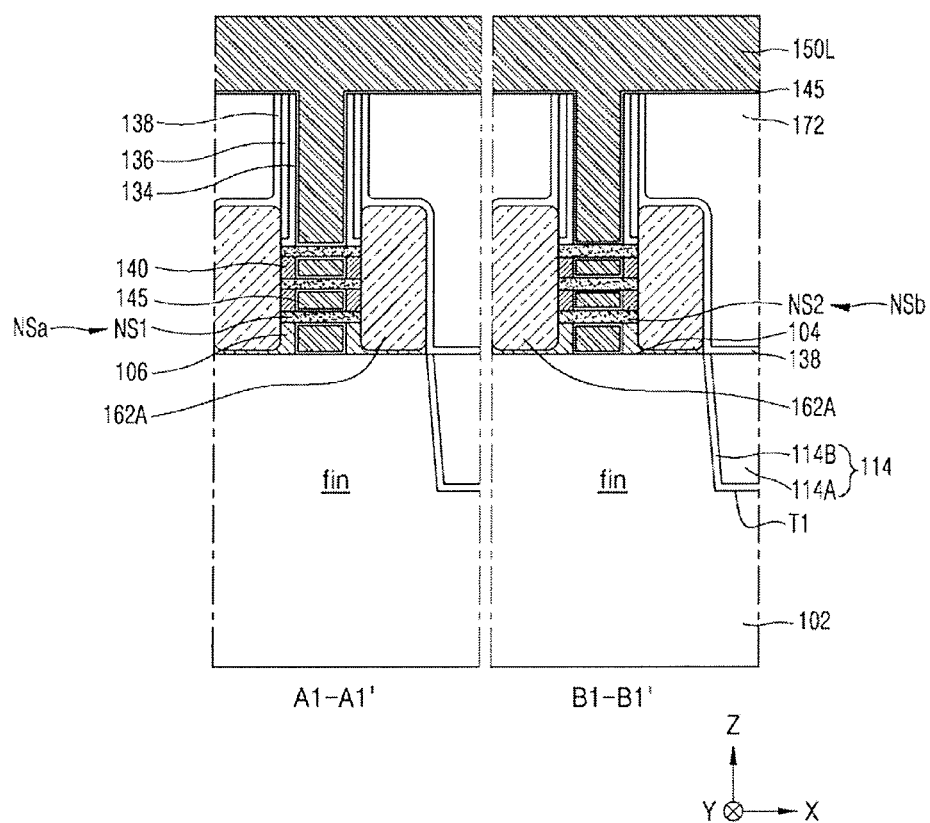

Referring to FIG. 24, after the native oxide layer is removed from the exposed surfaces of the nano sheets NS1 and NS2 and the fin activation areas FAa and FAb, the gate insulating layer 145 may be formed on surfaces exposed by the gate space GS (refer to FIG. 23). A conductive layer 150L may be formed to fill the gate space GS on the gate insulating layer 145 and to cover the inter-gate insulating layer 172.

In a structure of a semiconductor device corresponding to the process of FIG. 24, when taking a cross-sectional view as illustrated in FIG. 2B, there may be no interlayer insulating layer 174 illustrated. In addition, is the cross-sectional view would illustrate the conductive layer 150L for forming a gate, rather than illustrating the first and second gate electrodes 150a and 150b.

An upper portion of the conductive layer 150L for forming a gate may be partially removed until an upper surface of the inter-gate insulating layer 172 is exposed. This may be done to form the first and second gate electrodes 150a and 150b, filling the gate space GS. As described with reference to FIGS. 1 through 2B, the first and second gate electrodes 150a and 150b may include the main gate portion 150M (refer to FIG. 2A) covering the upper surfaces of the stack structures NSa and NSb, and the sub-gate portions 150S and 150S' (refer to FIG. 2A) connected to the main gate portion 150M and formed in spaces between the first nano sheets NS1 and between the second nano sheets NS2.

Furthermore, after the interlayer insulating layer 174 (refer to FIG. 2A) covering the first and second gate electrodes 150a and 150b and the inter-gate insulating layer 172 is formed, a plurality of contact holes exposing the semiconductor layer 162A may be formed by partially etching the interlayer insulating layer 174 and the inter-gate insulating layer 172. Then, the metal silicide layer 162B (refer to FIG. 2A) may be formed on upper surfaces of the plurality of semiconductor layers 162A which are exposed by the contact hole. In addition, the plurality of contact plugs 190 (refer to FIG. 2A), respectively connected to the semiconductor layers 162A through the metal silicide layer 162B may be formed to form the semiconductor device 100 of FIGS. 1 through 2B.

Figure 25:
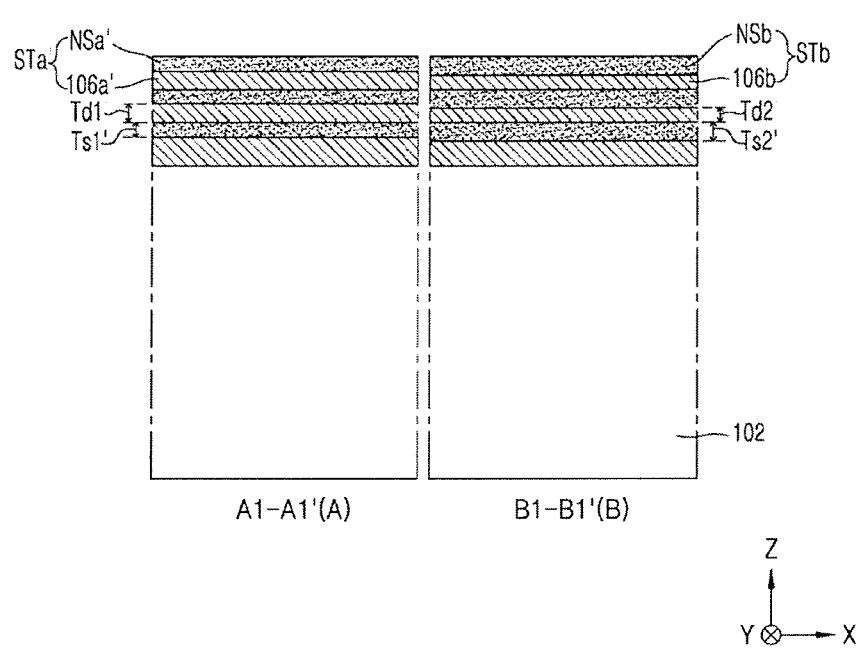
FIG. 25 is a cross-sectional view illustrating a process of manufacturing a semiconductor device, according to exemplary embodiments of the inventive concept.

FIG. 25 is a cross-sectional view for describing in detail a method of manufacturing a semiconductor device according to an embodiment, the cross-sectional view corresponding to the cross-sectional view of FIG. 9. Aspects already described with reference to FIGS. 1 through 24 will be briefly described or will not be described.

FIG. 25 is a cross-sectional view illustrating a process of manufacturing a semiconductor device, according to exemplary embodiments of the inventive concept. Referring to FIG. 25, the second stack structure STa' may be formed on the semiconductor substrate 102 in the first area A, and the first stack structure STb may be formed on the semiconductor substrate 102 in the second area B. This may be done using the processes illustrated in FIGS. 8A and 8B. As described with reference to FIGS. 8A and 8B, the second stack structure STa' may include the sacrificial semiconductor layers 106a' and the semiconductor layers NSa', and the first stack structure STb may include the sacrificial semiconductor layers 106b and the semiconductor layers NSb. The semiconductor layers NSa' of the second stack structure STa' may be formed to have a different thickness from the corresponding semiconductor layers NSb of the first stack structure STb. The sacrificial semiconductor layers 106a' of the second stack structure STa may have the same Ge concentration as the sacrificial semiconductor layers 106b of the first stack structure STb.

Thereafter, by performing the processes of FIGS. 10A through 24, the semiconductor device 100 of FIGS. 1 through 2B may be manufactured.

Figure 26:
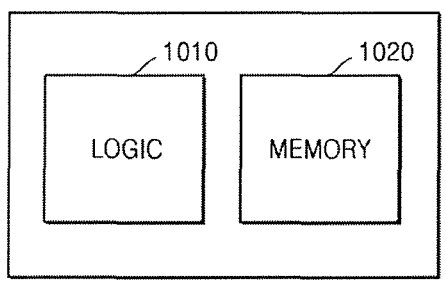
FIG. 26 is a block diagram of an electronic device including a semiconductor device formed according to exemplary embodiments of the inventive concept.

FIG. 26 is a block diagram of an electronic device including a semiconductor device formed according to exemplary embodiments of the inventive concept.

Referring to FIG. 26, an electronic device 1000 may include a logic device unit 1010 and a memory device unit 1020. The logic device unit 1010 may include standard cells performing desired logical functions, such as a counter, a buffer, etc. The logic device unit 1010 may include various types of logic cells including a plurality of circuit elements, such as transistors, registers, etc. For example, the logic cells may include AND, NAND, OR, NOR, exclusive OR (XOR), exclusive NOR (XNOR), an inverter (INV), an adder (ADD), a buffer (BUF), a delay (DLY), a filter (FILL), a multiplexer (MXT/MXIT), an or/and/inverter (OAI), an and/or (AO), an and/or/inverter (AOI), a D flip-flop, a reset flip-flop, a master-slave flip-flop, a latch, etc. However, the above-mentioned cells are only exemplary, and the logic cells manufactured according to an exemplary embodiment of the inventive concept are not limited thereto.

The memory device unit 1020 may include SRAM, DRAM, MRAM, RRAM, and/or PRAM.

The logic device unit 1010 and the memory device unit 1020 may include the semiconductor device 100, the semiconductor device 100*a*, the semiconductor device 100*b*, the semiconductor device 100*c*, and/or the semiconductor device 100*d*.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   a semiconductor substrate;
   a first fin activation area comprising a first fin extending in a first direction, wherein the first fin protrudes from the semiconductor substrate;
   a first nano sheet structure comprising at least two first nano sheets which extend in the first direction parallel to an upper surface of the first fin, and the at least two first nano sheets are spaced apart from the upper surface of the first fin and from each other;
   a second fin activation area comprising a second fin extending in the first direction, wherein the second fin protrudes from the semiconductor substrate;
   a second nano sheet structure comprising at least two second nano sheets which extend in the first direction parallel to an upper surface of the second fin, and the at least two second nano sheets are spaced apart from the upper surface of the second fin and from each other;
   a first gate electrode extending in a second direction crossing the first direction and surrounding the at least two first nano sheets, wherein a gate insulating layer is disposed between the first gate electrode and each of the at least two first nano sheets; and
   a second gate electrode extending in the second direction and surrounding the at least two second nano sheets, wherein a gate insulating layer is disposed between the second gate electrode and each of the at least two second nano sheets,
   wherein the at least two first nano sheets are connected to first source/drain areas of the first fin activation area,
   the at least two second nano sheets are connected to second source/drain areas of the second fin activation area,
   at least one of the at least two first nano sheets has a different thickness from at least one of the at least two second nano sheets, and
   wherein the thicknesses of each of the at least two first nano sheets and the at least two second nano sheets are measured in a third direction that is perpendicular to an upper surface of the semiconductor substrate.

2. The semiconductor device of claim 1, wherein the at least two first nano sheets are separated from each other in the third direction and have substantially the same thickness, and
   the at least two second nano sheets are separated from each other in the third direction and have substantially the same thickness.

3. The semiconductor device of claim 1, wherein the first gate electrode surrounds an upper surface, a lower surface, and side surfaces of each of the at least two first nano sheets, and
   the second gate electrode surrounds an upper surface, a lower surface, and side surfaces of each of the at least two second nano sheets.

4. The semiconductor device of claim 1, wherein the first source/drain areas are disposed on at least two side surfaces of the first gate electrode in the first direction, wherein the first source/drain areas are disposed on the first fin,
   the second source/drain areas are disposed on at least two side surfaces of the second gate electrode in the first direction, wherein the second source/drain areas are disposed on the second fin, and
   the at least two first nano sheets correspond to a channel area formed between the first source/drain areas, and the at least two second nano sheets correspond to a channel area formed between the second source/drain areas.

5. The semiconductor device of claim 4, wherein a first spacer is disposed between the at least two first nano sheets and between a side surface of the first gate electrode and one of the first source/drain areas, and
   a second spacer is disposed between the at least two second nano sheets and between a side surface of the second gate electrode and one of the second source/drain areas.

6. The semiconductor device of claim 1, wherein the at least two first nano sheets and the at least two second nano sheets comprise a same material.

7. The semiconductor device of claim 1, wherein the first fin activation area further comprises a third fin spaced apart from the first fin in the second direction, wherein the third fin extends in the first direction,
   the second fin activation area further comprises a fourth fin apart from the second fin in the second direction, wherein the fourth fin extends in the first direction,
   wherein the first nano sheet structure further comprises at least two third nano sheets corresponding to the third fin, and
   wherein the second nano sheet structure further comprises at least two fourth nano sheets corresponding to the fourth fin.

8. The semiconductor device of claim 7, wherein the first fin activation area further comprises at least one first additional fin spaced apart from the third fin in the second direction, wherein the at least one first additional fin extends in the first direction,
   the second fin activation area further comprises at least one second additional fin spaced apart from the fourth fin in the second direction, wherein the at least one second additional fin extends in the first direction,
   wherein the first nano sheet structure further comprises at least two additional first nano sheets corresponding to the at least one first additional fin, and
   wherein the second nano sheet structure further comprises at least two additional second nano sheets corresponding to the at least one second additional fin.

9. The semiconductor device of claim 1, wherein at least one of the at least two first nano sheets and at least one of the at least two second nano sheets have a thickness permitting an occurrence of a quantum confinement effect in the third direction.

10. The semiconductor device of claim 1, wherein the at least two first nano sheets and the at least two second nano sheets comprise silicon (Si).

11. The semiconductor device of claim 1, further comprising at least one additional nano sheet structure corresponding to at least one additional fin activation area, wherein the at least one additional nano sheet structure comprises at least two additional nano sheets, and the at least two additional nano sheets have thicknesses that are different from the thicknesses of the at least two first nano sheets and the thicknesses of the at least two second nano sheets.

12. A semiconductor device, comprising:
a semiconductor substrate including a first area and a second area;
a first nano sheet structure comprising at least two first nano sheets disposed in the first area, wherein the at least two first nano sheets are separated from each other and from an upper surface of the semiconductor substrate in a direction perpendicular to the upper surface of the semiconductor substrate, wherein the at least two first nano sheets extend in a first direction parallel to the upper surface of the semiconductor substrate; and
a second nano sheet structure comprising at least two second nano sheets disposed in the second area, wherein the at least two second nano sheets are separated from each other and from the upper surface of the semiconductor substrate in the direction perpendicular to the upper surface of the semiconductor substrate, wherein the at least two second nano sheets extend in the first direction parallel to the upper surface of the semiconductor substrate,
wherein the at least two first nano sheets are connected to first source/drain areas disposed in the first area, wherein the first source/drain areas are disposed on the upper surface of the semiconductor substrate,
the at least two second nano sheets are connected to second source/drain areas disposed in the second area, wherein the second source/drain areas are disposed on the upper surface of the semiconductor substrate, and
at least one of the at least two first nano sheets has a thickness that is different from a thickness of at least one of the at least two second nano sheets,
wherein the thicknesses of the at least one of the at least two first nano sheets and the at least one of the at least two second nano sheets are measured in the direction perpendicular to the upper surface of the semiconductor substrate.

13. The semiconductor device of claim 12, further comprising:
a first gate electrode surrounding upper, lower and side surfaces of the at least two first nano sheets, wherein a gate insulating layer is disposed between the first gate electrode and the at least two first nano sheets, and
a second gate electrode surrounding upper, lower and side surfaces of the at least two second nano sheets, wherein a gate insluting layer is disposed between the second gate electrode and the at least two second nano sheets,
wherein the first source/drain areas are disposed on opposite side surfaces of the first gate electrode in the first direction, and the second source/drain areas are disposed on opposite side surfaces of the second gate electrode in the first direction, and
the at least two first nano sheets correspond to a channel area formed between the first source/drain areas, and the at least two second nano sheets correspond to a channel area formed between the second source/drain areas.

14. The semiconductor device of claim 12, wherein the at least two first nano sheets and the at least two second nano sheets include silicon (Si) and have a thickness permitting an occurrence of a quantum confinement effect in the direction perpendicular to the upper surface of the semiconductor substrate.

15. The semiconductor device of claim 12, further comprising a third area of the semiconductor substrate and at least one additional nano sheet structure disposed in the third area,
wherein the at least one additional nano sheet structure comprises at least two additional nano sheets having thicknesses that are different from the thicknesses of the at least two first nano sheets and the at least two second nano sheets in the direction perpendicular to the upper surface of the semiconductor substrate, and
the at least two first nano sheets, the at least two second nano sheets, and the at least two additional nano sheets comprise a same material.

16. A semiconductor device, comprising:
a substrate including a first fin, a second fin and a third fin, each of which extends in a first direction;
a first gate electrode, a second gate electrode and a third gate electrode, each of which extends in a second direction crossing the first direction, wherein the first gate electrode overlaps the first fin, the second gate electrode overlaps the second fin, and the third gate electrode overlaps the third fin; and
at least two first nano sheets disposed on the first fin and spaced from the first fin and from each other in a third direction crossing the first and second directions, at least two second nano sheets disposed on the second fin and spaced from the second fin and from each other in the third direction, and at least two third nano sheets disposed on the third fin and spaced from the third fin and from each other in the third direction,
wherein the first gate electrode is disposed between the at least two first nano sheets and between the first fin and the first nano sheet most adjacent to the first fin, the second gate electrode is disposed between the at least two second nano sheets and between the second fin and the second nano sheet most adjacent to the second fin, and the third gate electrode is disposed between the at least two third nano sheets and between the third fin and the third nano sheet most adjacent to the third fin,
wherein one of the at least two first nano sheets has a first thickness, one of the at least two second nano sheets has a second thickness, and one of the at least two third nano sheets has a third thickness, wherein the first, second and third thicknesses are measured in the third direction, and
wherein at least two of the first, second and third thicknesses are different from each other.

17. The semiconductor device of claim 16, wherein the first, second and third thicknesses are all different from each other.

18. The semiconductor device of claim 16, wherein the at least two of the first, second and third thicknesses that are different from each other are the first and second thicknesses, wherein the first thickness is smaller than the second thickness, and wherein a distance in the third direction between adjacent first nano sheets of the at least two first nano sheets is greater than a distance in the third direction between adjacent second nano sheets of the at least two first nano sheets.

19. The semiconductor device of claim 18, wherein the at least two first nano sheets have rounded edges.

20. The semiconductor device of claim 16, wherein a source area and a drain area are disposed adjacent to the at least two first nano sheets along the first direction, wherein each of the source area and drain area includes a metal silicide layer stacked on a semiconductor layer.

\* \* \* \* \*